United States Patent [19]

Hingarh

[11] 4,396,980
[45] Aug. 2, 1983

[54] COMBINED INTEGRATED INJECTION LOGIC AND TRANSISTOR-TRANSISTOR LOGIC MICROPROCESSOR INTEGRATED CIRCUIT DESIGN

[75] Inventor: Hemraj K. Hingarh, San Jose, Calif.

[73] Assignee: Fairchild Camera & Instrument Corp., Mountain View, Calif.

[21] Appl. No.: 167,614

[22] Filed: Jul. 11, 1980

[51] Int. Cl.³ .......................... G06F 3/00; G06F 7/48
[52] U.S. Cl. ................................. 364/200; 307/475; 307/459
[58] Field of Search ... 364/200 MS File, 900 MS File; 307/475, 459

[56] References Cited

U.S. PATENT DOCUMENTS

| | | | |
|---|---|---|---|
| 3,757,306 | 9/1973 | Boore | 364/200 |
| 4,085,450 | 4/1978 | Tulpule | 364/900 |
| 4,106,090 | 8/1978 | Erickson et al. | 364/200 |
| 4,155,118 | 5/1979 | Lamiaux | 364/200 |
| 4,181,934 | 1/1980 | Marenin | 364/200 |

*Primary Examiner*—Eddie P. Chan
*Attorney, Agent, or Firm*—Kenneth Olsen; Theodore S. Park; Michael J. Pollock

[57] ABSTRACT

A microprocessor integrated circuit design has improved partitioning between integrated injection logic (I²L) and transistor-transistor logic (T²L) in the integrated circuit. An information bus structure incorporating a bidirectional input and output buffer and a bidirectional input and output multiplexer minimizes the number of internal bus lines in the integrated circuit. An improved T²- I²L interface circuit and structure supplies a T²L input to a plurality of I²L input stages, each having a restricted cross-sectional area resistor element in the base of an I²L input transistor. A storage register in the integrated circuit has a multiplexer portion provided at each flip-flop circuit of the register. A high speed feed forward flip-flop circuit is employed in registers of the integrated circuit where speed is critical. An improved voltage regulator and current source combination in a programmable logic array (PLA) reduces PLA temperature sensitivity. A pair of I²L clocking pulse input transistors in a T²L master-slave circuit avoids capacitive coupling problems and allows the master-slave circuit to operate over a much wider temperature range. A cycle counter for the micro-processor integrated circuit implemented as an improved ripple down counter requires a minimum number of gates while avoiding significant delay in operation.

14 Claims, 23 Drawing Figures

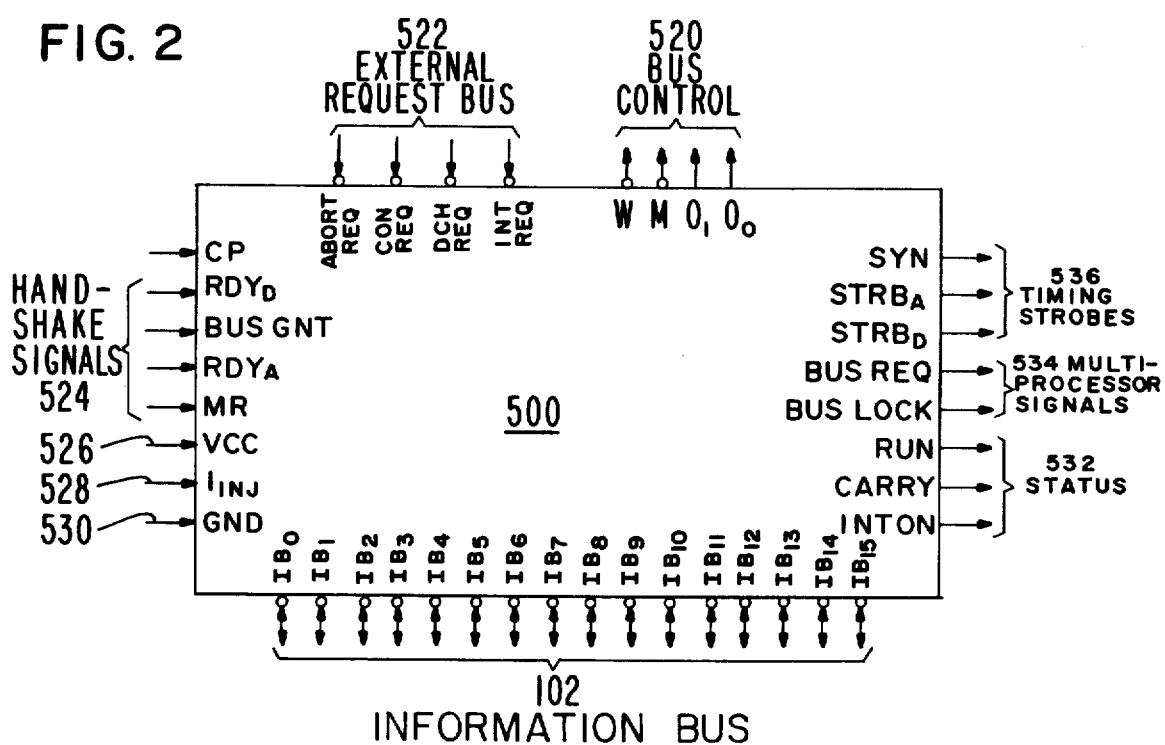
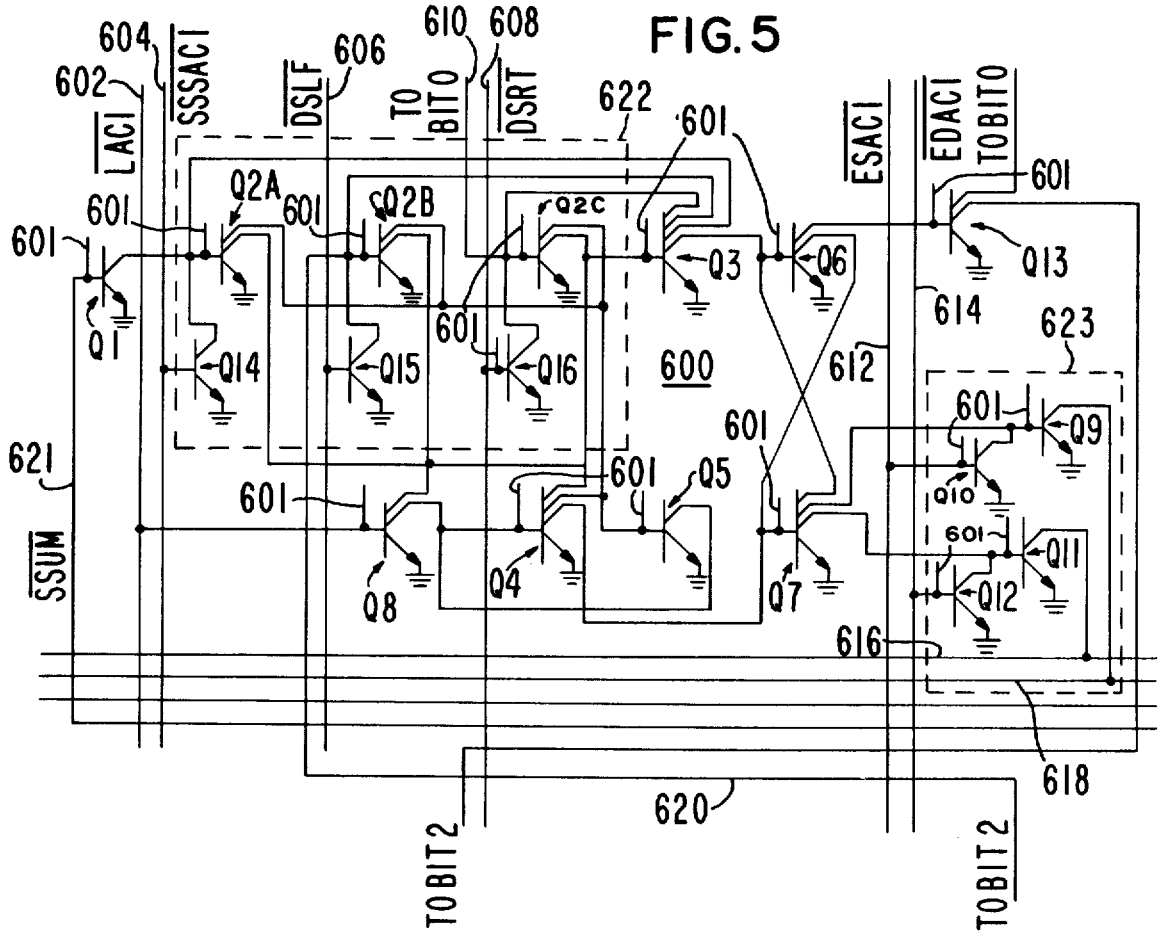

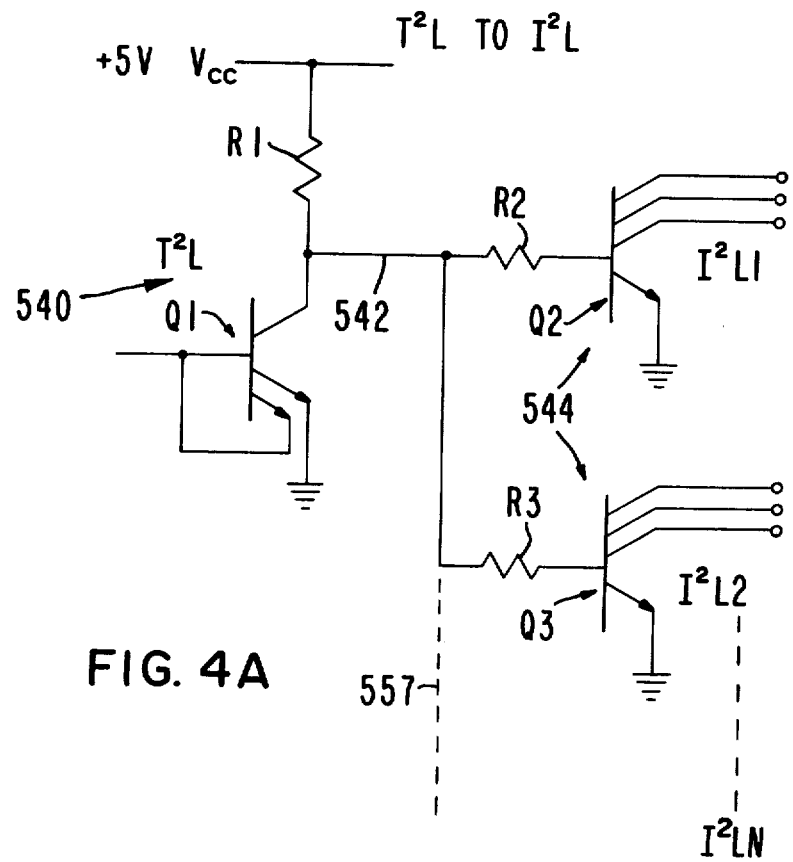
FIG. 4A
FIG. 4B
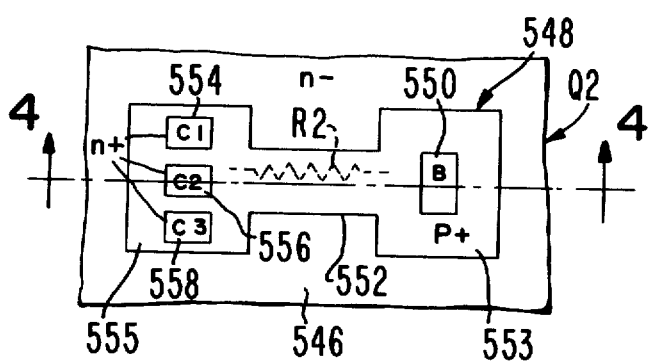
FIG. 4C

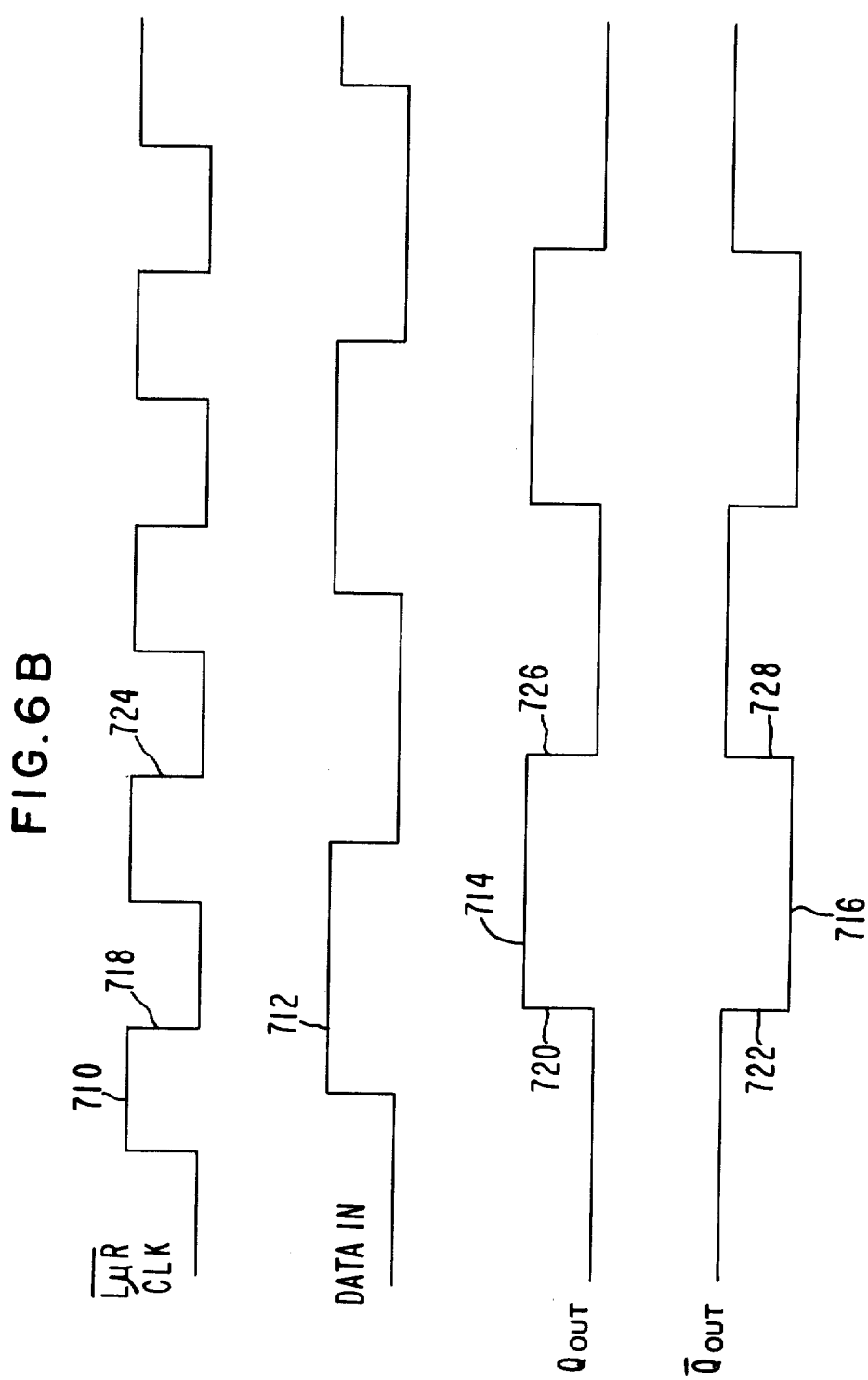

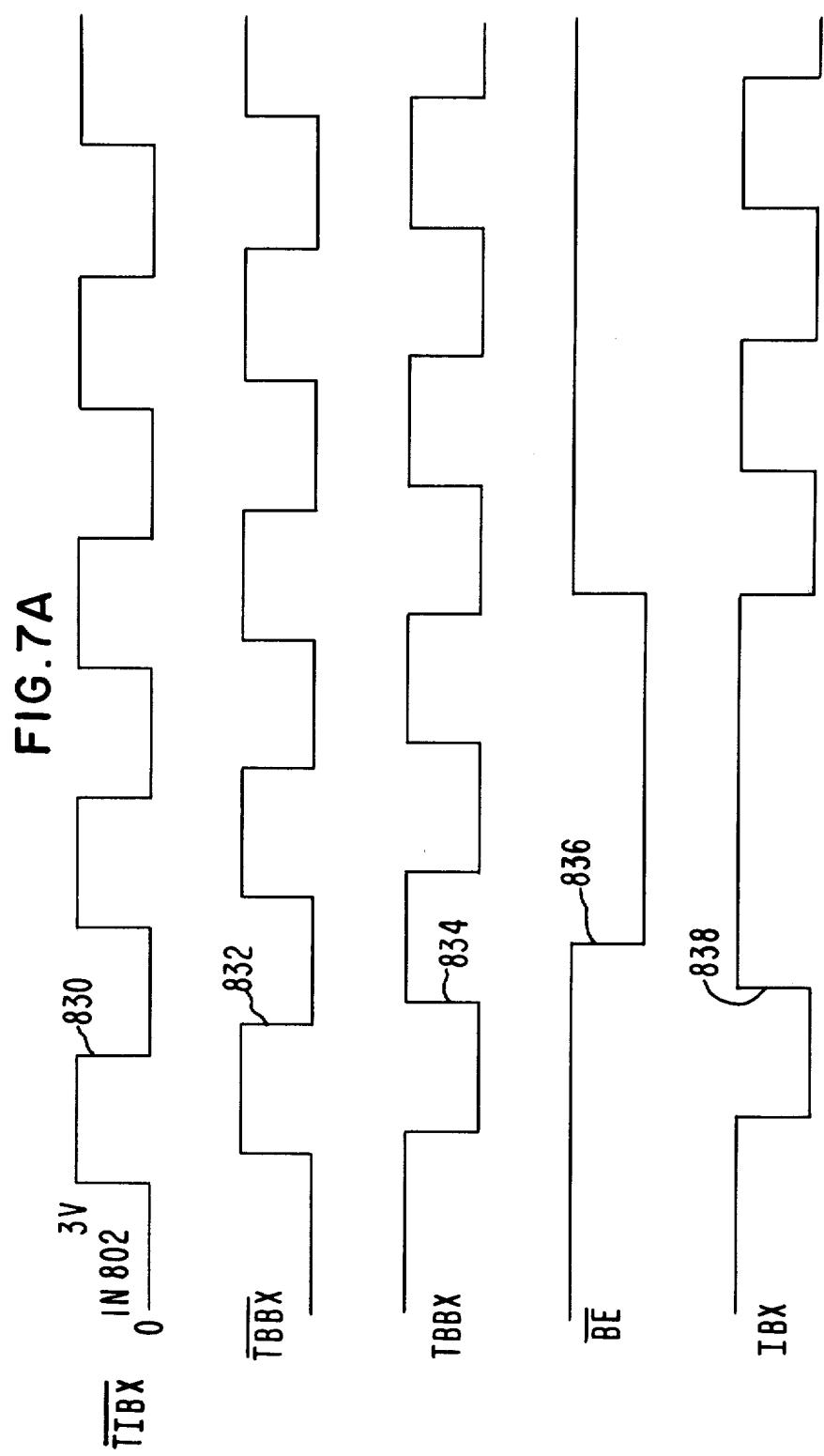

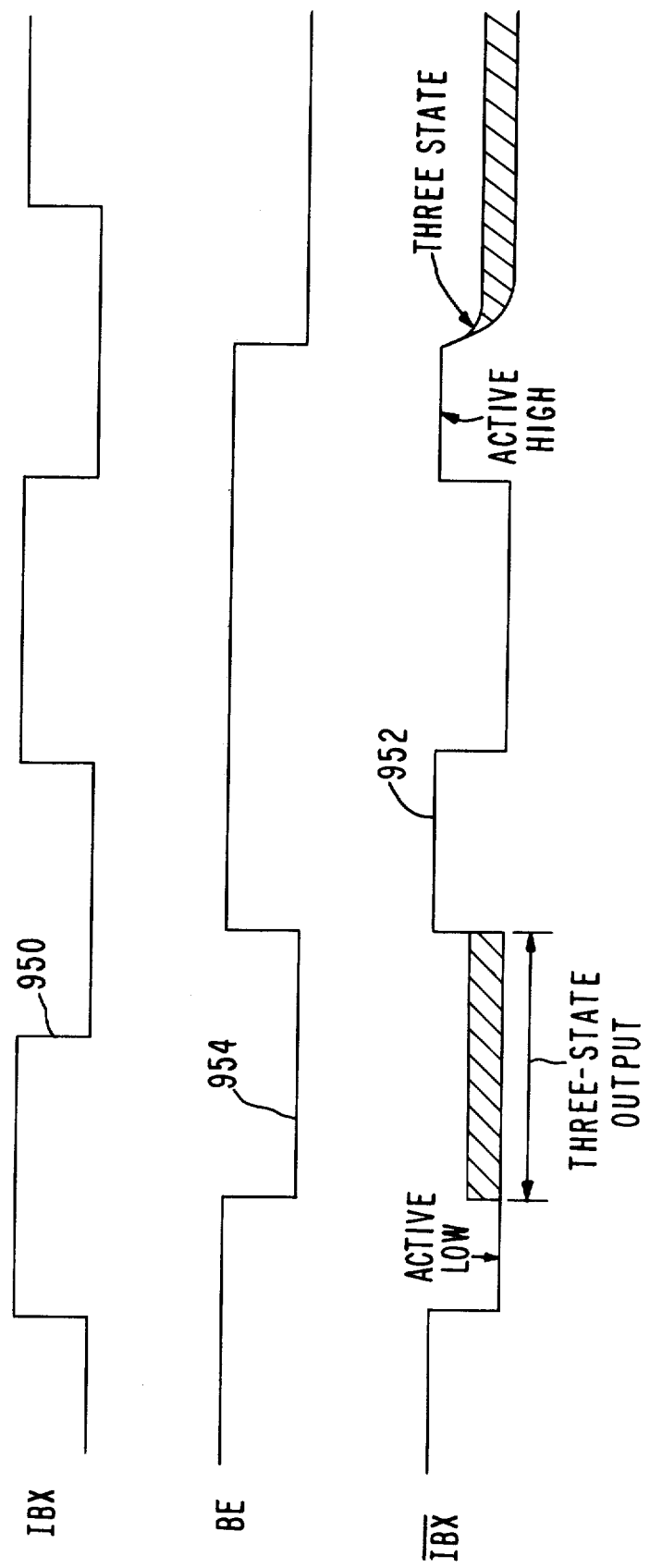

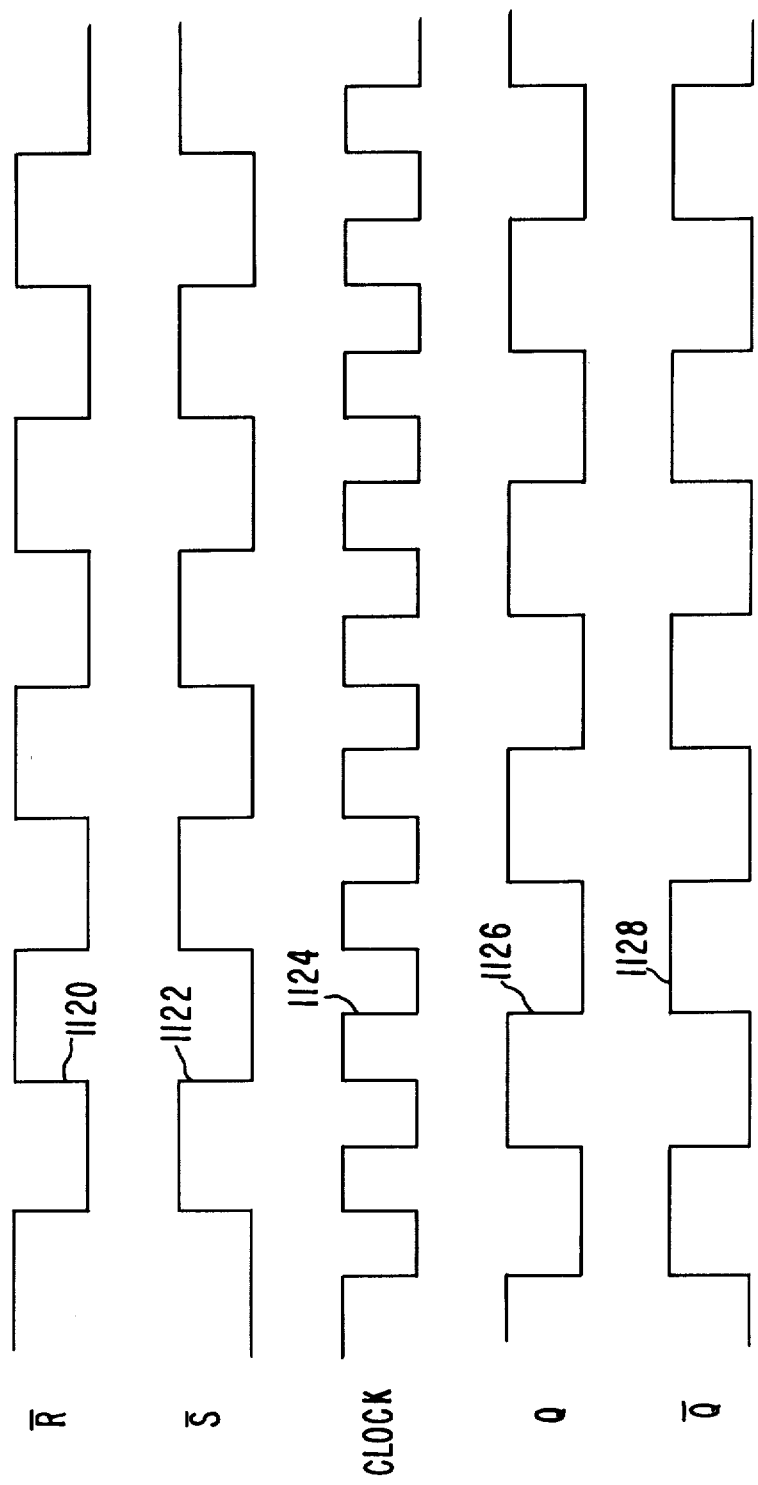

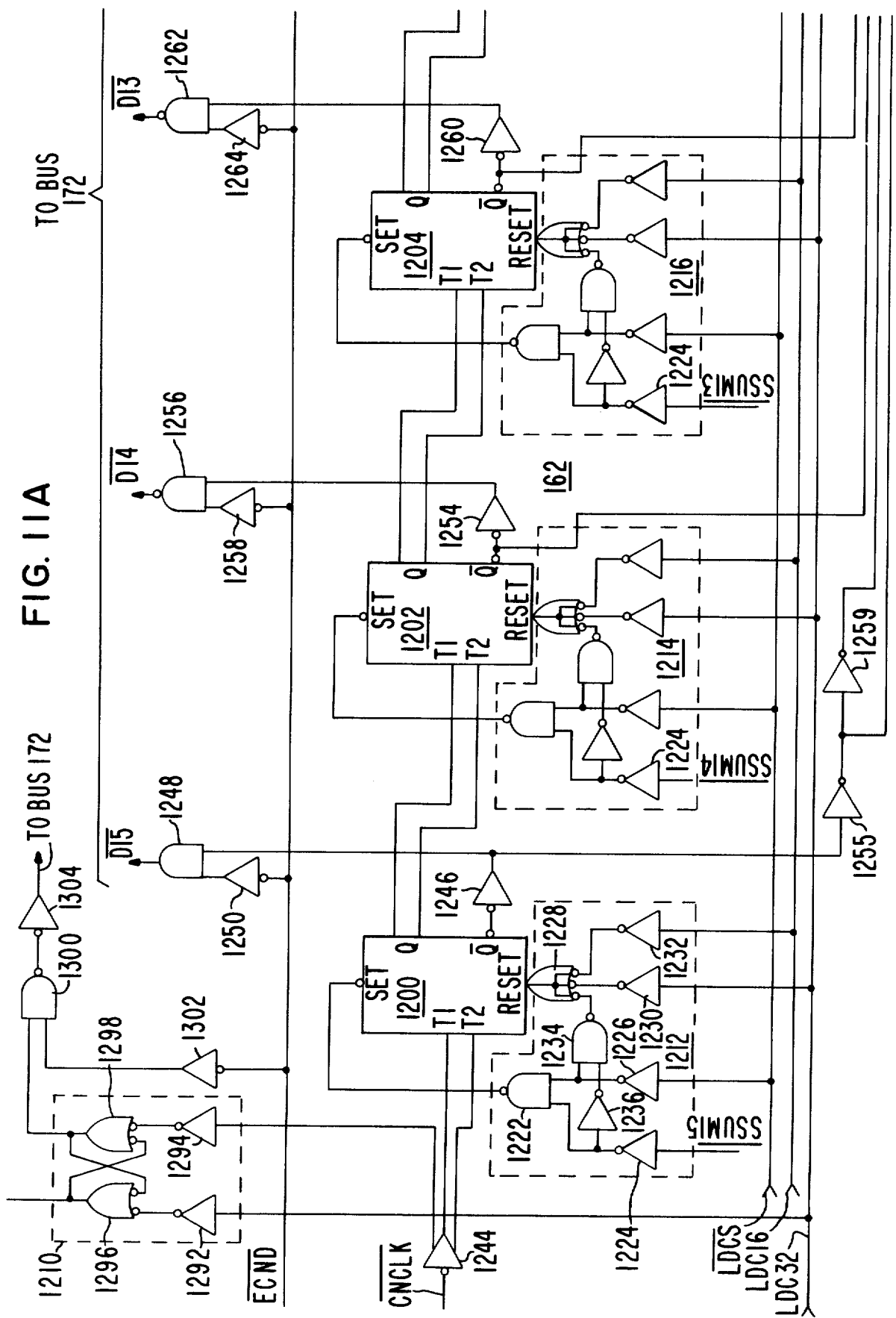

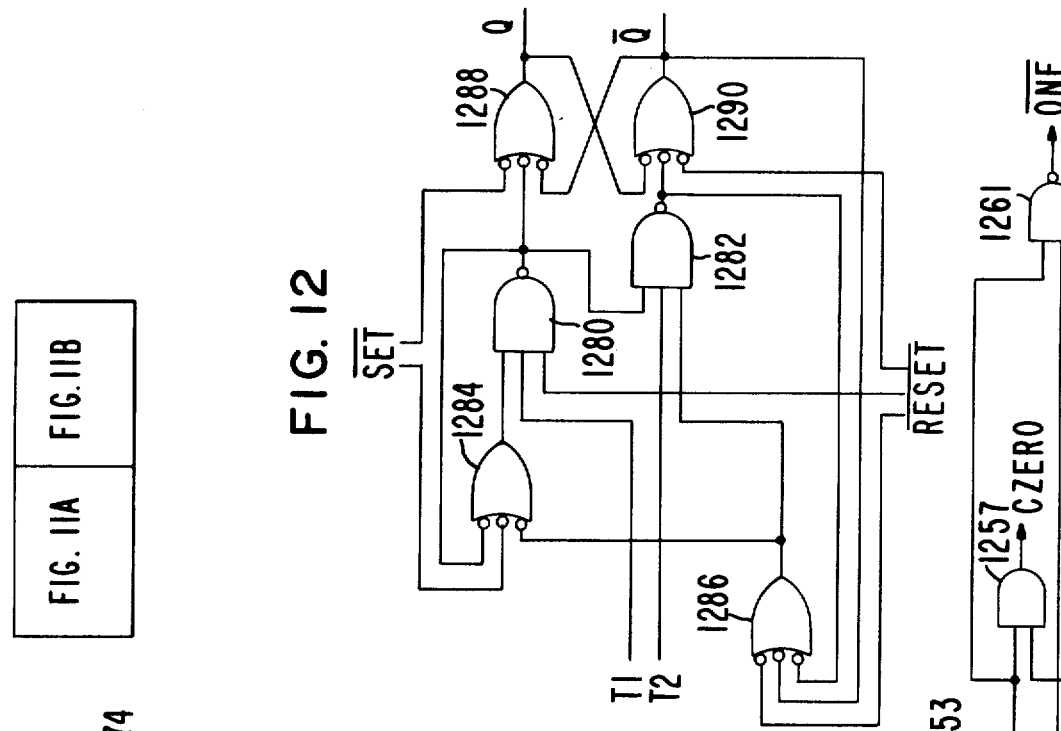
FIG. 11
| FIG. 11A |
| FIG. 11B |
FIG. 12
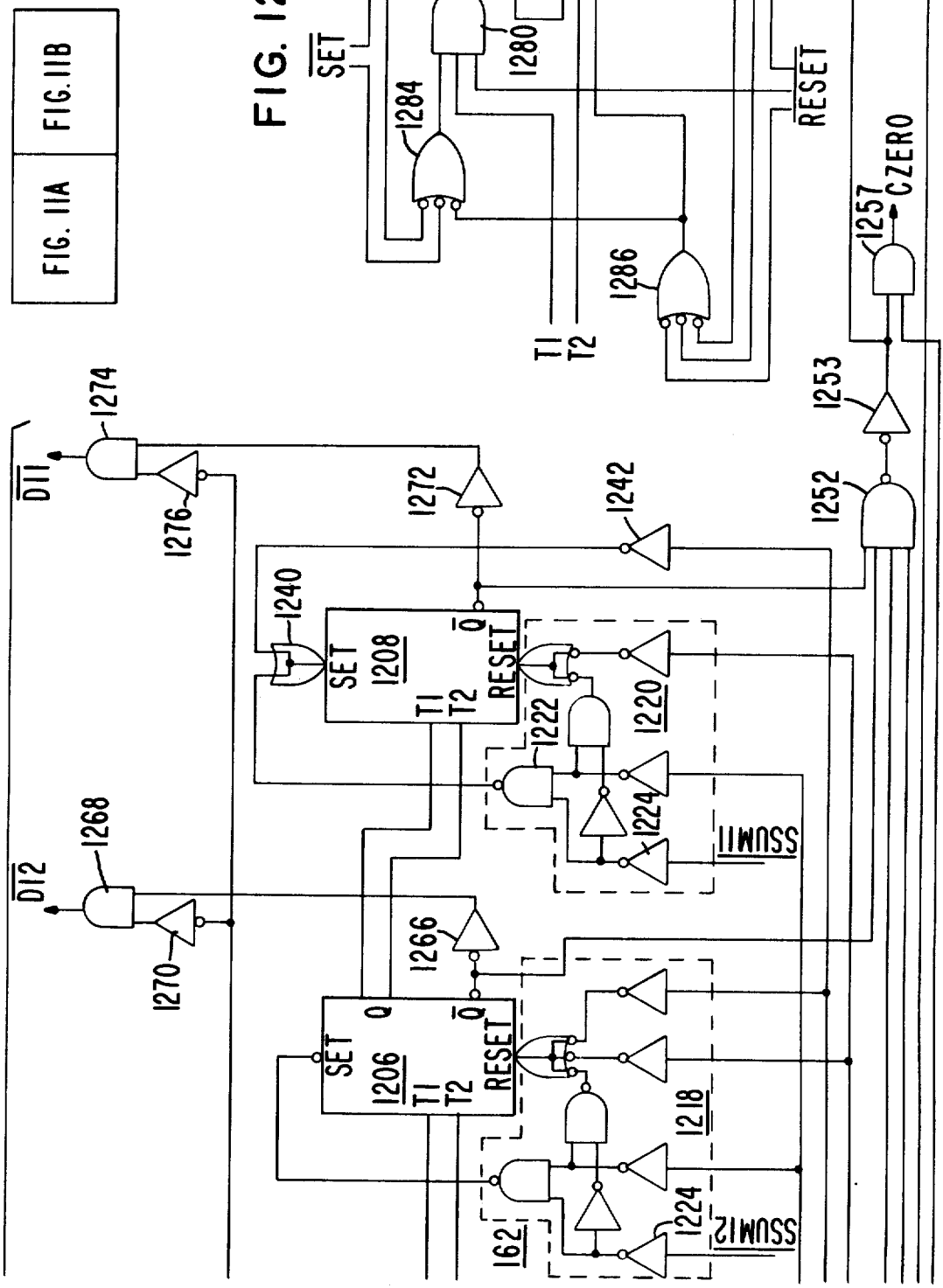
FIG. 11B

1

COMBINED INTEGRATED INJECTION LOGIC AND TRANSISTOR-TRANSISTOR LOGIC MICROPROCESSOR INTEGRATED CIRCUIT DESIGN

CROSS REFERENCE TO RELATED APPLICATIONS

This application contains a common disclosure and is concurrently filed with a commonly assigned application Ser. No. 167,607, filed July 11, 1980 by Michael G. Mladejovsky, entitled, "CYCLE COUNTER FOR MICROPROCESSOR INTEGRATED CIRCUIT," which contains claims to a related invention.

Additionally, this application covers improvements in the microprocessor system described in the following commonly assigned applications, all filed May 30, 1980:

Application Ser. No. 155,832, by Yeshayahu Mor and Dan Wilnai entitled "HIGH PERFORMANCE MICROPROCESSOR SYSTEM."

Application Ser. No. 155,831 by Yeshayahu Mor entitled, "MICROPROCESSOR WITH IMPROVED REGISTERS AND ARITHMETIC LOGIC UNIT DATA PATH."

Application Ser. No. 155,153 by Yeshayahu Mor and Allan M. Schiffman, entitled "MICROPROCESSOR WITH IMPROVED ARITHMETIC LOGIC UNIT DATA PATH."

Application Ser. No. 155,141 by Allan M. Schiffman, Yeshayahu Mor and Gary R. Burke, entitled, "MICROPROCESSOR WITH DATA AND PROGRAM PROTECTION."

Application Ser. No. 155,152 by Gary R. Burke, entitled, "MICROPROCESSOR WITH IMPROVED INFORMATION BUS UTILIZATION."

FIELD OF THE INVENTION

This invention relates to a high performance microprocessor integrated circuit design. More particularly, it relates to such a microprocessor integrated circuit incorporating both transistor-transistor logic ($T^2L$) and integrated injection logic ($I^2L$). Most especially, it relates to such a microprocessor integrated circuit having an improved partitioning between the $T^2L$ and $I^2L$ portions of the integrated circuit, to take full advantage of the presence of both logic types in the same integrated circuit.

DESCRIPTION OF THE PRIOR ART

Microprocessors employing both $T^2L$ and $I^2L$ logic in a single integrated circuit are known in the art. For example, the commercially available microprocessor available from Fairchild Camera and Instrument Corporation, Mountain View, Calif., under the designation 9440 incorporates both forms of circuits. A system description of the 9440 microprocessor may be found in commonly assigned Erickson et al, U.S. Pat. No. 4,106,090.

The five earlier filed co-pending applications previously listed disclose various system innovations which produce significant improvement in performance characteristics of the system disclosed in the Erickson et al patent. In the course of implementing the system described in these five applications as an integrated circuit incorporating both $T^2L$ and $I^2L$ circuits, additional innovations have been made to take full advantage of the performance potential of the combined $T^2L$ and $I^2L$ integrated circuit.

SUMMARY OF THE INVENTION

Accordingly, it is an object of this invention to provide an improved circuit and transistor structure in an $I^2L$ circuit for providing a plurality of outputs from a single input.

It is another object of the invention to provide an improved interface between a $T^2L$ output and a plurality of $I^2L$ inputs.

It is still another object of the invention to provide a microprocessor integrated circuit in which the number of lines in bus structures internal to the integrated circuit is reduced.

It is yet another object of the invention to provide a microprocessor integrated circuit incorporating a programmable logic array (PLA) with reduced sensitivity to temperature and power supply changes.

It is a still further object of the invention to provide a flip-flop circuit especially adapted for use in microprocessor registers and having a reduced time delay between its input and its output.

It is yet another object of the invention to provide a register storage circuit including a selectively directable output at each bit of a register incorporating the storage circuit.

It is a further object of the invention to provide a master-slave flip-flop circuit for use in a timing portion of a microprocessor integrated circuit, which circuit has an improved reliability of operation over a wider temperature and power supply range, and has more noise margin at its inputs.

It is a still further object of the invention to provide a microprocessor with a cycle counter configured with a minimum number of gates and to allow efficient implementation of multiple cycle instructions involving either a fixed or variable number of cycles.

These and related objects may be achieved through use of the microprocessor integrated circuit and circuits for incorporation in the microprocessor integrated circuit herein disclosed. In one aspect of the invention, a microprocessor integrated circuit includes a central processing unit (CPU) with an independent address data path and an independent arithmetic logic unit (ALU) data path, each capable of simultaneous operation during a clock cycle. An information bus is connected to supply and receive address and data information to and from each data path. The information bus includes a bidirectional input and output (I/O) buffer for receiving and supplying information externally of the integrated circuit. A bidirectional I/O multiplexer is connected to receive information inputs from and supply information outputs to the bidirectional I/O buffer. The bidirectional I/O multiplexer is further connected to supply information to an input multiplexer shared by the two data paths and to receive information from an output multiplexer shared by the data paths. The bidirectional I/O multiplexer is also preferably connected to supply information independently of the shared input multiplexer to a status register in the ALU data path. The I/O buffer is also preferably connected to supply information inputs to a PLA in a control unit for the microprocessor. The I/O buffer converts $T^2L$ level signals to $I^2L$ level signals for use by $I^2L$ elements in the microprocessor and converts $I^2L$ level outputs from $I^2L$ circuits in the microprocessor to $T^2L$ level signals for use by $T^2L$ circuits in the microprocessor and for use externally of the microprocessor. The I/O buffer also supplies and receives T²L level inputs and outputs to and from T²L logic elements in the microprocessor.

In another aspect of the invention, the microprocessor includes an improved T²L circuit interface to an I²L circuit. The interface includes a T²L output stage. A plurality of I²L circuit input stages are connected to receive outputs from the T²L output stage. Each such input stage includes a bipolar transistor having a base, an emitter connected to a predetermined potential, and a plurality of collectors. The base of the bipolar transistor is connected to receive an output signal from the T²L output stage. The connection between the T²L output stage and the base of the bipolar transistor includes a resistive element incorporated within the base. This resistive element includes first and second base portions of a given conductivity type of semiconductor material joined by a third base portion of semiconductor material of the given conductivity type having a restricted cross sectional area relative to the cross sectional area of the first and second portion. Such a construction prevents any one of the I²L input stages from preferentially drawing current to be supplied to each input stage.

In a further aspect of the invention, storage registers in the ALU data path of the microprocessor integrated circuit include a plurality of interconnected flip-flop circuits. Each flip-flop circuit has an output control circuit for selectively directing an output of each flip-flop to a desired one of two locations connected to receive the output. In essence, where the two locations connected to receive the output are source and destination inputs to the ALU, source and destination multiplexers for the ALU are thus distributed with a source and destination multiplexer portion at each flip-flop circuit. In the case of a storage register implemented as a universal shift left, shift right shift register, a similar approach is employed for data inputs to each flip-flop circuit of the registers by providing a plurality of data input transistors and associated control transistors for each flip-flop circuit.

In still another aspect of the invention, a high speed feed forward D-type flip-flop circuit reduces device delays in flip-flops used in portions of the microprocessor integrated circuit where speed is most critical. This circuit includes first, second and third latches. There is a data input to the first latch and a clock input to the first and second latch. First and second outputs of the third latch provide a signal and its complement from the D-type flip-flop circuit. A first transistor is connected with its input parallel to an input of a second transistor in the first latch and receives the clock input and a signal complementary to the data input. The first transistor has an output connected to the first output of the third latch. A similar feed forward approach is used for the second output of the third latch by providing a third transistor having an input connected parallel to an input of a fourth transistor in the second latch. An output of the third transistor is connected to the second output of the third latch.

In a further aspect of the invention, a PLA circuit in the microprocessor integrated circuit eliminates temperature and power supply dependence of prior art PLA circuits by providing a voltage regulator connected to supply a regulated voltage from a predetermined potential which is subject to variation. A current source is connected between the predetermined potential and the outputs of a plurality of parallel AND gates. Selected ones of the outputs of the plurality of AND gates are provided as inputs to at least one OR gate. An output of the at least one OR gate is supplied as an input to an output transistor connected between the output of the at least one OR gate and an output terminal of the PLA circuit. The programming of the PLA is provided by selected combinations of the AND and OR gates. Further details on the PLA programming are available in any of the five earlier filed co-pending applications referenced above. The current source includes a current source transistor connected to receive the regulated voltage from the voltage regulator as a control input and a resistor and connected to the current source transistor.

In a still further aspect of the invention the microprocessor integrated circuit includes a T²L master-slave flip-flop circuit in which first and second I²L transistors forming a part of the master flip-flop are connected between a source of clocking pulses and the slave flip-flop of the circuit. Using such I²L transistors in the master flip-flop circuit avoids accidental turning on of these transistors due to capacitive coupling between the bases of these transistors and the $\overline{R}, \overline{S}$ input diodes of the circuit. This coupling gets worse at high temperatures and with a power supply to variation. Using I²L instead of conventional transistors reduces the circuit sensitivity and allows it to operate over much wider temperature ranges. The master-slave flip-flop circuit provides timing signals for operation of the microprocessor integrated circuit.

In yet another aspect of the invention, the microprocessor integrated circuit includes an improved cycle counter in the ALU data path. The cycle counter has a plurality of flip-flop circuits interconnected to operate as a ripple down counter. An output to each flip-flop circuit is connected to a next flip-flop circuit to supply two clock inputs to the next flip-flop circuit. The microprocessor integrated circuit includes means connected to set the counter to at least one constant predetermined value for a repetitive operation performed in the ALU data path and another means to set the counter to a variable value dependent on an operation to be performed in the ALU data path.

The attainment of the foregoing and related objects, advantages and features of the invention should be more readily apparent to those skilled in the art after review of the following more detailed description of the invention, taken together with the drawins, in which:

BRIEF DESCRIPTION OF THE DRAWINGS

FIG. 2 is a plan view of a microprocessor integrated circuit in accordance with the invention, showing the layout of the external connector pins thereof.

FIG. 4A is a circuit diagram of a T²L to I²L interface circuit used in the microprocessor integrated circuit of this invention.

FIG. 4B is a plan view of an integrated circuit layout of a portion of the circuit shown in FIG. 4A.

FIG. 4C is a cross section of the layout in 4B, taken along the line 4-4.

FIG. 5 is a circuit diagram of a flip-flop circuit employed in one of the registers of the microprocessor integrated circuit of this invention.

FIG. 6B is a set of waveform diagrams useful for understanding operation of the circuits shown in FIGS. 6 and 6A.

FIGS. 7A and 8A are waveform diagram respectively useful for understanding operation of the FIG. 7 and FIG. 8 circuits.

FIG. 10A is a set of waveform diagrams useful for understanding operation of the circuit in FIG. 10.

FIG. 11 shows the relationship between FIGS. 11A and 11B.

FIGS. 11A and 11B are a diagram partly in block form and partly in logic diagram form showing a cycle counter used in the microprocessor integrated circuit of this invention.

FIG. 12 is a logic diagram of portions of the cycle counter shown in FIGS. 11A and 11B.

DETAILED DESCRIPTION OF THE INVENTION

Figure 1:
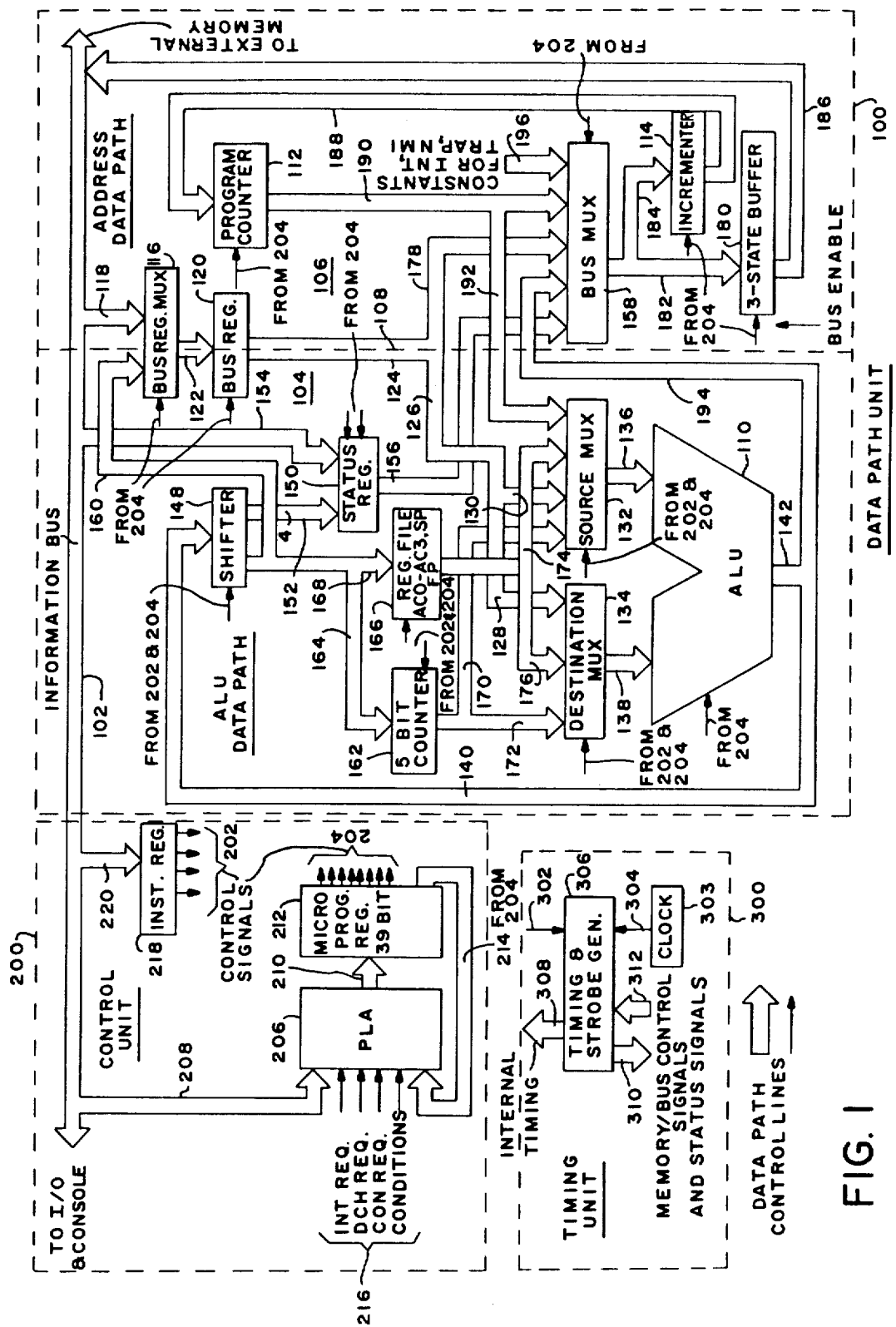
FIG. 1 is a block diagram of a microprocessor system incorporating the invention.

Turning now to the drawings, more particularly to FIG. 1, there is shown a microprocessor in accordance with the invention in block diagram form. The microprocessor includes a data path unit 100, a control unit 200 and a timing unit 300. Information bus 102 connects the data path unit 100 and the control unit 200. Control line 302 connects the timing unit 300 to the control unit 200. Control lines 202 and 204 are also connected between the control unit 200 and the data path unit 100, as indicated in FIG. 1.

The data path unit 100 includes two separate data paths 104 and 106. The data paths 104, to the left of line 108, includes an ALU 110. It therefore performs arithmetic and related operations on information circulating in that data path. For convenience, data path 104 will be referred to as the ALU data path. Data path 106, to the right of line 108, includes a program counter 112 and an incrementer 114. The data path 106 is primarily for the purpose of selecting the address for the next instruction during a given machine cycle while an operation is being performed by the ALU data path 104. The data path 106 will therefore be referred to as the address data path for convenience. The provision of the separate ALU data path 104 and the address data path 106 allows overlapping of fetch and ALU operations in the same machine cycle, thus speeding up the execution of operations in the microprocessor.

Turning now to the ALU data path 104, information bus 102 is connected to bus register multiplexer 116 by bus 118. Bus register multiplexer 116 is in turn connected to bus register 120 by bus 122. Bus register 120 and bus register muliplexer 116 are shared by the ALU data path 104 and the address data path 106, and the function of bus register multiplexer 116 is to direct the appropriate information signals on bus 102 to each data path 104 and 106. Buses 124, 126, 128 and 130 connect the bus register 120 to source and destination multiplexers 132 and 134. The source and destination multiplexers 132 and 134 in turn supply operands from their various inputs on buses 136 and 138, respectively, to the ALU 110. Bus 140 connects output 142 of ALU 110 to shifter 148. One output of the shifter 148 is connected to status register 150 by bus 152. Another input to the status register 150 is from information bus 102 via bus 154. Bus 156 connects an output of the status register 150 to bus multiplexer 158 in address data path 106. Another output of the shifter 148 is connected to bus register multiplexer 116 by bus 160, to five-bit counter 162 by bus 164 and to register file 166 by bus 168. An output of the five-bit counter 162 is connected to source multiplexer 132 and destination multiplexer 134 by buses 170 and 172, respectively. An output of the register file 166 is connected to source multiplexer 132 and destination multiplexer 134 by buses 174 and 176, respectively.

Bus register 120 is connected to bus multiplexer 158 in address data path 106 by bus 178. Bus multiplexer 158 is connected to three-state buffer 180 by bus 182 and to incrementer 114 by bus 184. An output of the three-state buffer 180 is connected to information bus 102 by bus 186. An output of the incrementer 114 is connected to program counter 112 by bus 188. An output of the program counter 112 is connected to the bus multiplexer 158 by bus 190, and to the source multiplexer 132 in ALU data path 104 by bus 192. Output 142 of the ALU 110 is connected to the bus multiplexer 158 by bus 194. Constants to be employed for certain operations to be explained below are supplied as an input to the bus multiplexer 158 on bus 196 from special logic circuits provided for that purpose, to be described below.

The control unit 200 includes a programmable logic array (PLA) 206, which contains a suitable control program for operation of the microprocessor. Further details of the control program are included as an appendix to the above-referenced five earlier filed co-pending related applications, the disclosures of which are incorporated by reference herein. PLA 206 is connected to information bus 102 by bus 208 and by bus 210 to a 39-bit microprogram register 212. Control lines 204 from the microprogram register are connected to the various functional elements of the data path unit 100 as shown, to provide the appropriate control signals in response to control program commands supplied to the register 212 on bus 210. Bus 214 connects another output of the register 212 to form another input of the PLA 206. Request lines 216 form additional inputs to the PLA 206. An instruction register 218 is also connected to the information bus 102 by bus 220. Control signal lines 202 forming outputs from the instruction register 218 are connected to the appropriate functional elements of the data path unit 100 as shown. The instruction register 218 initiates control signals on the lines 202 in response to instructions from a user program, entered in the register 218 via information bus 102, resulting in the performance of operations on data entered in the ALU data path 104 via information bus 102, bus register multiplexer 116 and bus register 120.

Timing unit 300 generates required timing signals to allow the various functional elements of the data path unit 100 and the control unit 200 to function together, in response to control and status signals received from those units. The timing unit 300 includes a timing and strobe generator 306. A fundamental frequency is supplied as clock pulses on line 304 from a quartz crystal oscillator or other suitable source of clock pulses shown as clock 303. The timing and strobe signals are generated by appropriate frequency division of the fundamental clock frequency in the generator 306. The internal timing signals are supplied by the generator 306 on bus 308. Memory and bus control signals are supplied by the generator 306 on bus 310. Status signals from the functional elements of the control unit 200 and the data path unit 100 are supplied to the generator 306 on bus 312.

Certain features of the system as shown in FIG. 1 provide special advantages for the microprocessor of this invention. As a result of the connection from shifter 148 via bus 160, the bus register multiplexer 116 and bus register 120 may act as a source of addresses for jump operations. The bus register multiplexer 116 is required because bus register 120 is a part of both ALU data path 104 and address data path 106. As is indicated in FIG. 1, register file 166 consists of four general purpose registers for accumulators AC0 through AC3, as well as two special purpose registers, the stack pointer (SP) and the frame pointer (FP). Floating point operations require the handling of 32 bit numbers. For this purpose, the AC0 and AC1 registers are treated as one. In order to carry out floating point operations in one machine cycle, the AC1 register has a different form of construction than typical registers. It is a universal shift left or right register which operates in a manner similar to a conventional shift register. Certain logic is also required between the AC0 and AC1 registers, which is explained in more detail in the above referenced five earlier filed co-pending applications. This relationship between the AC0 and AC1 registers enables very fast execution times for repetitive instructions involving shifts of 32 bits, such as multiply (MUL), divide (DIV), normalize (NORM) and parametric double shifts. In addition to their use as general purpose registers, the AC2 and AC3 registers are used as index registers and the AC3 register also serves as a subroutine linkage register. Multiple cycle parametric instructions, such as MUL, DIV, double shifts and NORM instructions are also facilitated by the fact that counter 162 is part of the data path. Including the counter 162 in the data path means that it can be used for more efficient multiplication and division, rather than writing such repetitive operations 16 times in the PLA 206. Having the counter 162 in the data path means that the result from a previous cycle as well as the result of a present cycle are available for manipulation in the more efficient multiplication and division, as explained more fully in the above referenced earlier filed co-pending applications. The 16 bit bus register 120 is split into 2 eight-bit (1 byte) registers with separate control. As a result, a swap operation can be used for very fast execution of byte instructions. The system is also configured so that the information bus 102 and the PLA 206 can be used to implment console operations, through further use of the request line 216 labeled CON REQ. Previous miroprocessors required use of additional lines for providing control signals from the console connected to the PLA or the use of I/O or memory instructions. Part of the console operation includes a small program residing in PLA 206, which employs seven internal terminals of the PLA 206 to test approximately 90% of the data paths in the system. This test feature is useful both for testing by the user of the system and for testing during the manufacture of microprocessor integrated circuits including the system of FIG. 1.

The source multiplexer 132 selects, under microprogram control of miroprogram register 212, a source register, which supplies a 16 bit operand to the ALU 110 on bus 136. The source register can be any of the registers or accumulators in register file 166, the bus register 120, the program counter 112, the five bit counter 162, or 16 zeros. The destination multiplexer 134 selects, also under microprogram control by microprogram register 212, a destination register, which supplies another 16 bit operand to the ALU 110 and also constitutes the destination for the result of the ALU operation. The destination register can also be any of the registers or accumulators in register file 166, the bus register 120, or the 5 bit counter 162. In unary operations, the destination operand is zero.

The arithmetic logic unit 110 can perform nine different operations on two 16-bit operands, generating a 16 bit result and four status flags: carry, zero, overflow, and sign. The carry, zero and sign status flags are modified by the shifter 148. The nine operations are move, complement (one's complement), add, subtract, increment, add one's complement, negate (two's complement), and, or (MOV, COMP, ADD, SUB, INC, ADC, NEG, AND, OR). The 17-bit output of the ALU 110 (16 bits and carry) is transferred to the shifter 148 on bus 140. The 16 bit output of the ALU 110 also goes to the bus multiplexer 158 as the operand in write cycles.

The shifter 148 is a 17 bit four input to one output multiplexer, which is capable of performing one of the following operations on the 17 bit output of the ALU 110: passing the 17 bits unshifted, rotating the 17 bits through carry to the left, rotating the 17 bits through carry to the right, and swapping the two bytes of the 16 bit word and passing the carry unaffected. Unless inhibited, at the end of a cycle, the output of the shifter 148 is loaded into the destination register in register file 166 and into the carry flag of status register 150.

The status register 150 comprises four separate one bit registers, i.e., carry, overflow, a 32K or 64K memory size indicating register and a trap enable/disable register. Disabling the trap function in the microprocessor allows programs written for systems without a trap function to be run on this system. Each of these flags in the status register 150 is affected differently as specified in the relevant instructions. They are treated as one register only on push flags (PSHF) and pop flags (POPF) instructions. The default state of the status register 150, entered by master reset, is 32K/64K=32K and enable trap (ETRP)=1.

The five bit counter 162 is used for multiple cycle instructions where many identical microinstructions have to be repeated, such as multiply/divide, normalize and double shift instructions. The counter 162 is loaded at the beginning of each of these instructions with the appropriate number of counts, and causes the same microinstruction to repeat itself that number of times. The number of counts may be either fixed by the instruction itself, such as 16 or 32 in the case of multiply, divide, and normalize instructions, or the number of counts may be programmed or controlled, such as in parametric shift instructions. The linkage register in register file 166 to counter 162 is always the AC2 register. On parametric shifts, the five bit counter 162 receives its input from AC2, and in normalize instructions, counter 162 supplies its contents to register AC2.

The bus register multiplexer 116 selects the data to be stored in bus register 120. The two sources of data for the bus register 120 are the information bus 102 and the shifter 148. The information bus 102 is selected when the source of data is external of the microprocessor, such as in a read, fetch, or I/O device input cycle. The shifter 148 is selected when the source of data is one of the registers in the ALU data path 104.

At the end of any relevant cycle, under microprogram control, the bus register 120 latches the data supplied by the bus register multiplexer 116. The bus register 120 is the only register in the ALU data path 104 capable of storing data directly from the information bus 102.

The bus multiplexer 158 selects, under microprogram control, data to be supplied to the information bus 102 on bus 186. The possible sources of data to be supplied to the information bus 102 are the program counter 112, which supplies the address in most fetch cycles, the bus register 120, which supplies the address in memory cycles, the ALU 110, which supplies the operands in memory and I/O cycles, and the status register 150, which supplies the data in push flags type instructions. The three-state buffer 180 is enabled when the bus multiplexer 158 is supplying data or addresses to the information bus 102. Otherwisem buffer 180 is disabled.

The program counter 112 is a 16 bit register that contains the address of the next instruction. Counter 112 gets the address from the incrementer 114 via bus 188. On a typical fetch cycle, the bus multiplexer 158 selects the program counter 112 for its input, the contents of the program counter 112 propagate through the bus multiplexer 158 and the three state buffer 180, and are interpreted as the memory address. In parallel, that same address is incremented by one through incrementer 114, and at the end of the cycle, the output of the incrementer (PC+1) is latched into the program counter 112. At this point, the program counter once again contains the address of the next instruction.

The operation of the components of the data path unit 100 are governed by the control unit 200. The PLA 206 contains the microprogram, the pipeline or microprogram register 212 latches the microinstructions executed in the current cycle, and the instruction register 218 supplies additional control bits during some instructions.

A complete description of further system details and all the circuits necessary to implement the system shown in FIG. 1 is contained in any one of the five earlier filed related applications listed above, the disclosures of which are incorporated by reference herein.

Figure 1A:
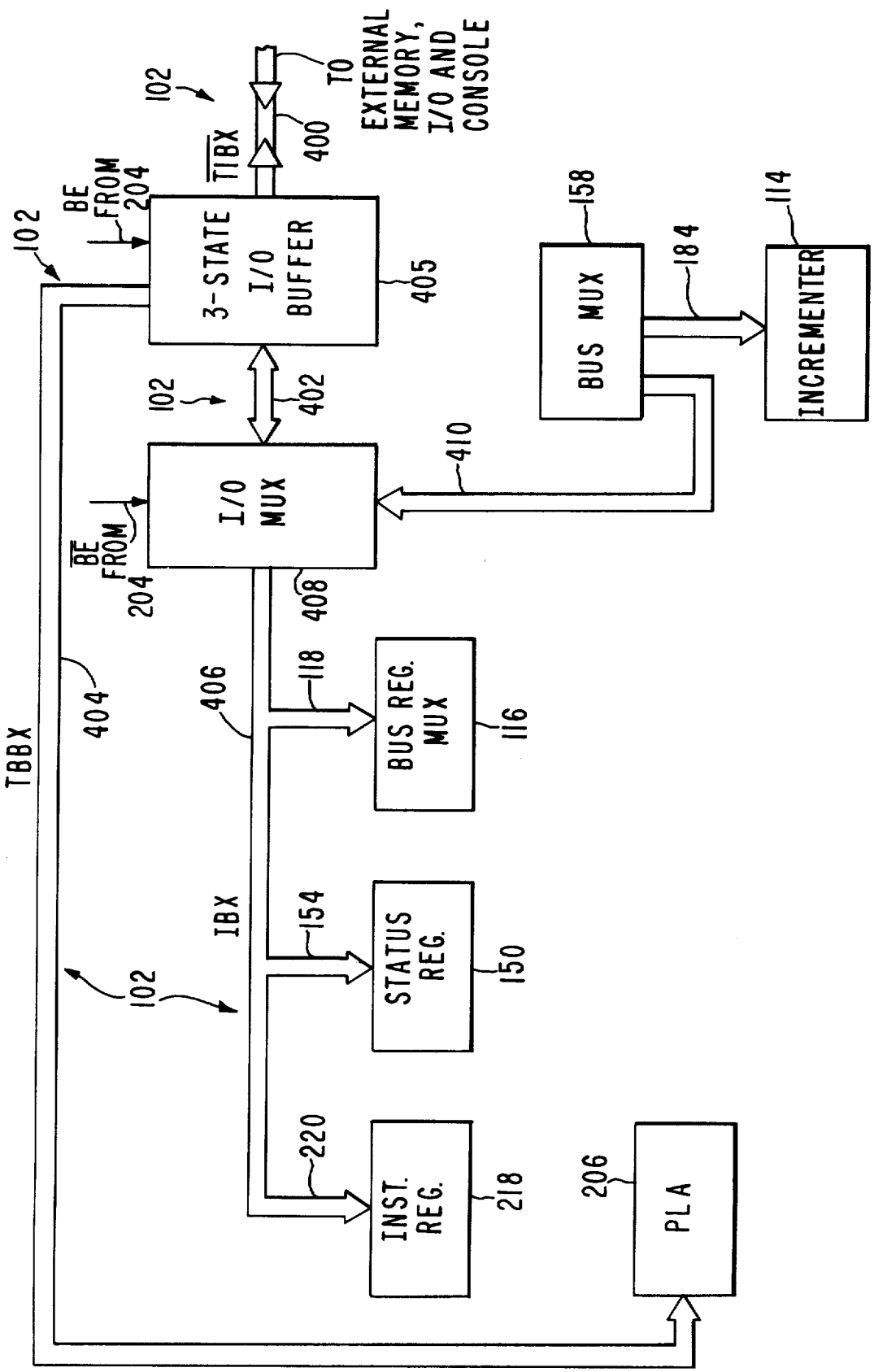
FIG. 1A is a modified form of a portion of the block diagram shown in FIG. 1.

FIG. 1A shows a modification of a portion of the system shown in FIG. 1. It should be understood that the portions of the system in FIG. 1 not shown in FIG. 1A are present and otherwise connected as shown in FIG. 1. Where possible, corresponding reference numbers to those employed in FIG. 1 are used in FIG. 1A. As shown, the information bus 102 is divided into segments 400, 402, 404 and 406. A bidirectional, three-state I/O buffer 405 is connected between the information bus segments 400 and 402. The bidirectional I/O buffer 405 is also connected between the segments 400 and 404. Segment 402 connects the bidirectional I/O buffer 405 with a bidirectional I/O multiplexer 408. Similarly, segment 404 connects the bidirectional I/O buffer to PLA 206. Bidirectional I/O buffer 405 receives and supplies $T^2L$ signals on segment 400. The buffer 405 converts $T^2L$ level input signals to $T^2L$ level signals and supplies them to I/O multiplexer 408 on segment 402. Buffer 405 also converts $I^2L$ level output signals to $T^2L$ levels and supplies them on segment 400 to portions of a system including the microprocessor integrated circuit of this invention external to the integrated circuit. Buffer 405 also supplies $T^2L$ level signals on segment 404 to PLA 206. I/O multiplexer 408 supplies $I^2L$ level input signals on segment 406 to bus register multiplexer 116 on bus 118, to status register 150 on bus 154 and to instruction register 218 on bus 220. The bus register multiplexer 116, status register 150 and instruction register 218 then operate on the basis of the input information signals as in FIG. 1. Bus multiplexer 158 is connected to the I/O multiplexer 408 by bus 410. Bus multiplexer 158 supplies $I^2L$ level output information signals to the I/O multiplexer 408 for transmission via segment 402 to the I/O buffer 405 for conversion to $T^2L$ level and subsequent output.

Segmenting the information bus 102 in this manner and providing a bidrectional I/O buffer and bidirectional I/O multiplexer means that a 16 bit wide bus may be used internally in the integrated circuit chip for both information inputs and outputs, rather than requiring separate 16 bit busses for this purpose. This approach also promotes better partitioning of the integrated circuit into $T^2L$ portions and $I^2L$ portions, identified below in the discussion of FIG. 3. A $\overline{BE}$ signal from control lines 204 provides directional control for the I/O buffer 405, and a BE signal provides directional control for the I/O multiplexer 408.

A plan view of the preferred embodiment of the invention as a single microprocessor integrated circuit 500 is shown in FIG. 2. Such an integrated circuit includes all of the circuits necessary to provide the system functions shown in FIG. 1 in a single silicon chip having dimensions of approximately 0.25 inch on a side. Terminals IB0 through IB15 of the integrated circuit 500 comprise the information bus 102, also shown in FIG. 1. The bus control 520 comprises the W, M, $O_1$ and $O_0$ terminals. The external request bus 522 comprises the ABORT request terminal, the console request terminal, the data channel request terminal and the interrupt request terminal. The corresponding bus handshake signals are supplied on clocking terminal CP, ready data terminal $RDY_D$, the bus grant terminal BUS GNT, the ready address terminal $RDY_A$ and the memory ready terminal MR, which comprise the bus handshake terminals 524. Terminal 526 is connected to a +Vcc potential. Terminal 528 is connected to a current source $I_{INJ}$. Terminal 530 is grounded. Status terminals 532 provide the run, carry and interrupt on signals. Multi-processor signal terminals 534 provide the bus request and the bus lock signals required when operating the microprocessor 500 in a multi-processor mode. Timing strobe terminals 536 provide the SYN synchronizing signal, the address strobe signal STRBA and the data strobing signal STRBD.

Figure 3:
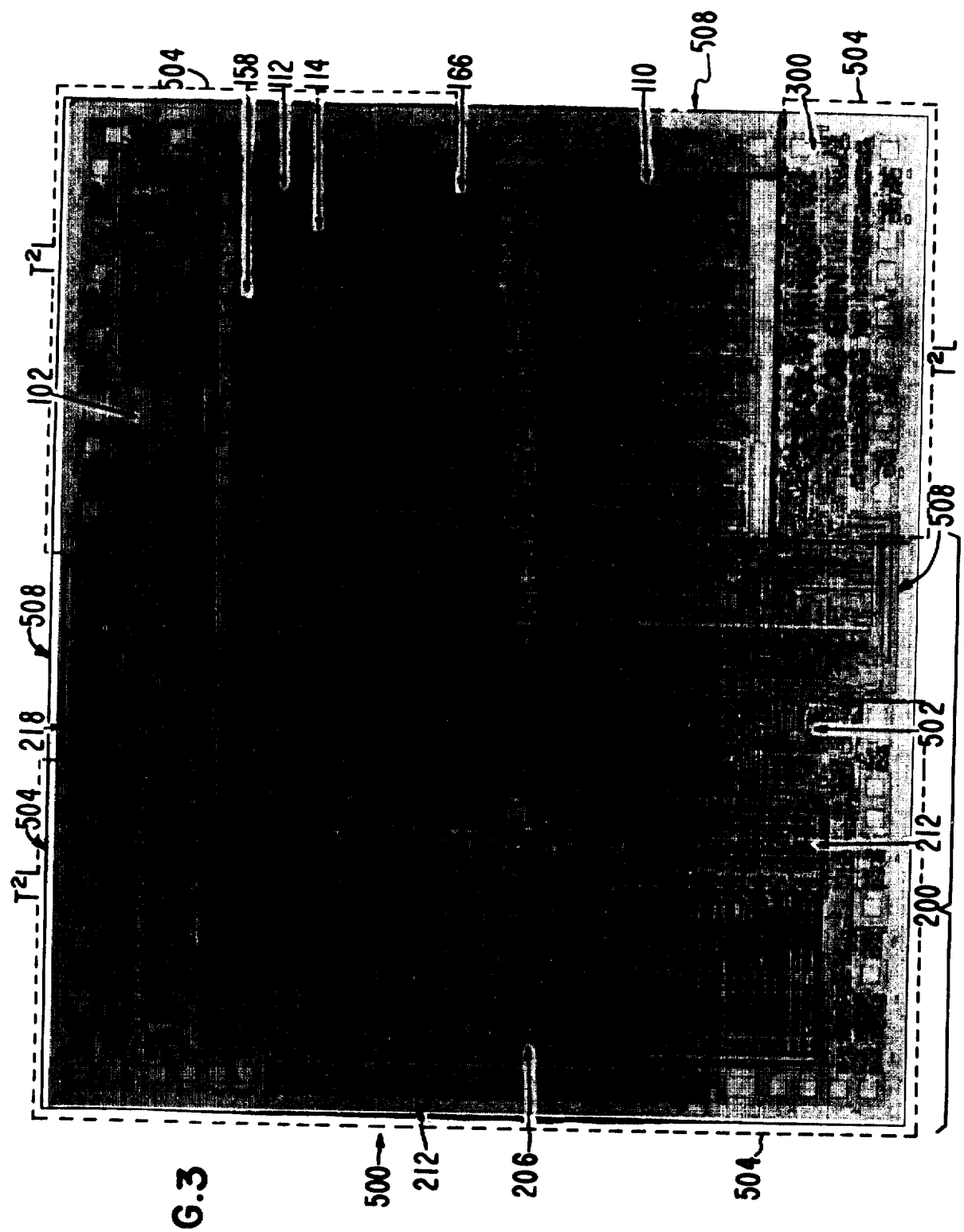
FIG. 3 is a photomicrographic enlargement of a microprocessor integrated circuit in accordance with the invention, showing interior details.

FIG. 3 is a photographic reproduction of a microprocessor integrated circuit 500 in accordance with the invention. It should be recognized that the circuit 500 is approximately 0.25 inch on a side, but is enlarged to show detail. The information bus 102 extends across the top and down the right hand side of the circuit 500 as shown. The bus multiplexer 158, program counter 112 and incrementer 114 are located near the upper right hand corner of the chip, as shown. The register file 166 is located immediately beneath the bus multiplexer 158, program counter 112 and incrementer 114. The ALU 110 is located beneath the register file 166. The timing unit 300 is located beneath the ALU 110. The control unit 200 is located below the information bus 102 and to the left of the other elements described above. The PLA 206 is located in the left hand portion of the control unit 200. The instruction register 218 is located at the top middle of the chip 500. The various control circuits 502 for the control unit 200 are located immediately to the left of the bus multiplexer 158, program counter 112, incrementer 114, register file 166, ALU 110, and timing unit 300. As explained more fully in the above referenced related applications, the microprogram register 212 is divided into an A register and a B register. These two registers comprising the microprogram register 212 are located, respectively, to the right and to the left of PLA 206.

As shown, the integrated circuit chip 500 is divided into $T^2L$ portions indicated by the dotted lines 504, and an $I^2L$ portion 508 comprising the remainder of the chip 500. This combination of two logic families in a single integrated circuit chip provides the speed and power advantages of $T^2L$ logic with the packing density advantages of $I^2L$ logic. A unique interface circuit approach between the two logic families is provided where they interact in the chip 500. Details of the interface circuit approach are shown in FIGS. 4A through 4C. A $T^2L$ output stage 540 provides its output on line 542 to $I^2L$ input stages 544. While two of the $I^2L$ stages 544 are shown, it should be recognized that more such $I^2L$ input stages 544 may be provided, up to, for example, 60 such stages as provided in some of the $T^2L$-$I^2L$ interfaces in integrated circuit chip 500 (FIG. 3), connected in parallel to receive the output of $T^2L$ output stage 540. Transistor Q1 of the $T^2L$ output stage 540 has its first emitter connected to its base. Its second emitter is grounded. The collector of transistor Q1 is connected to the +5 volt Vcc potential by resistor R1. Output line 542 of the $T^2L$ output stage 540 is connected to the bases of transistors Q2 and Q3 via resistors R2 and R3. The emitters of transistors Q2 and Q3 are grounded. The collectors of transistors Q2 and Q3 each provide an $I^2L$ level signal. FIG. 4B shows a plan view of transistor Q2, as provided in integrated circuit 500. N type region 546 comprises the emitter of the transistor Q2, and surrounds the remainder of the transistor. P-type region 548 comprises the base of transistor Q2, and is connected to the line 542 by base contact 550. Base region 548 has a "dog bone" configuration as shown, including a portion 552 of reduced cross-sectional area relative to portions 553 and 555. The portion 552 provides sufficient resistance to form the resistor R2 shown in FIG. 4A. The "dog bone" construction reduces the relative variation between resistors R2 and R3 and corresponding additional resistors connected as indicated at 557. N-type regions 554, 556 and 558 respectively form the first, second and third collectors of transistor Q2. By laying out transistor Q2 and the remaining corresponding transistors in the $I^2L$ input stage 544 with the dog bone construction shown in FIG. 4B, variations in output signal levels that the multiple collectors of the transistors Q2, Q3 and corresponding additional transistors provide are minimized. In this manner, a larger number of $I^2L$ level signals with minimum variation can be obtained from a single $T^2L$ output, thus avoiding signal "glitches" in a chip 500 as complex as shown in FIG. 3. The dog bone construction is used, for example, in transistors Q1, Q8, Q10 and Q12 of FIG. 5, transistor Q1 in FIG. 6 (note particularly the layout of transistor Q1 shown in FIG. 6A), and transistor Q11 in FIG. 8, all of which are discussed further below.

In general, the integrated circuit fabrication processes described in commonly assigned Peltzer, U.S. Pat. No. 3,648,125, entitled "Method of Fabricating Integrated Circuits with Oxidized Isolation and the Resulting Structure," O'Brien, U.S. Pat. No. 3,962,717, entitled "Oxide Isolated Integrated Injection Logic with Selective Guard Ring," and O'Brien, U.S. Pat. No. 3,993,513, entitled "Combined Method for Fabricating Oxide-Isolated Vertical Bipolar Transistors and Complementary Oxide-Isolated Lateral Bipolar Transistors and the Resulting Structures" may be used to fabricate the integrated circuit of this invention. However, certain modifications of those processes are made in order to provide the $T^2L$ portions 504 and the $I^2L$ portion 508 in the same integrated circuit 500. In specific, the photomask set used to define the diffusion, contact and interconnection patterns has first portions corresponding to the $T^2L$ portions 504 of the integrated circuit laid out in accordance with $T^2L$ ground rules and a second portion corresponding to the $I^2L$ portion 508 of the integrated circuit laid out in accordance with $I^2L$ ground rules. Some modification to diffusion temperatures and times may also be necessary to provide suitable diffusion dimensions in the $T^2L$ and $I^2L$ portions of the circuit simultaneously, although those dimensions are in part ground rule dependent.

Turning now to FIG. 5, there is shown a novel storage circuit 600 used for the bi-directional shift register AC1 in register file 166 shown in FIG. 1. The base of transistor Q1 is connected to receive an $\overline{SSUM}$ signal. The collector of transistor Q1 is connected to the base of transistor Q2A and to the collector of transistor Q14. A first one of the multiple collectors of transistor Q2A is connected to a first one of the multiple collectors of each of transistors Q2B and Q2C. A second multiple collector of transistor Q2A is connected to a second multiple collector of each transistor Q2B and Q2C. The base of transistor Q2A is also connected to a third multiple collector of transistor Q3. The second multiple collector of transistor Q3 is connected to the base of transistor Q2B, which is also connected to the collector of transistor Q15. The first multiple collector of transistor Q3 is connected to the base of transistor Q2C, which is also connected to the collector of transistor Q16. The fourth multiple collector of transistor Q3 is connected to the base of transistor Q6, which is also connected to the first multiple collector of transistor Q7. The second multiple collectors of transistors Q2A, Q2B and Q2C are all connected to the first multiple collector of transistors Q4 and Q8 and to the base of transistor Q3. The second multiple collector of transistor Q4 and the first multiple collectors of transistors Q2A, Q2B and Q2C are all connected to the base of transistor Q5. The third multiple collector of transistor Q4 is connected in a common connection with the second multiple collector of transistor Q6 to the base of transistor Q7. The collector of transistor Q5 is connected in a common connection with the second collector of transistor Q8 to the base of transistor Q4. The first multiple collector of transistor Q7 is connected in a common connection with the fourth multiple collector of transistor Q3 to the base of transistor Q6. The second multiple collector of transistor Q7 is connected in a common connection with the collector of transistor Q10 to the base of transistor Q9. The third multiple collector of transistor Q7 is connected in a common connection with the collector of transistor Q12 to the base of transistor Q11. The first multiple collector of transistor Q13 is connected to the base of a transistor in bit 0 of the AC1 register corresponding to the transistor Q2B shown in FIG. 5. The second multiple collector of transistor Q13 is connected to the base of a transistor in a bit 2 of the AC1 register corresponding to transistor Q2C shown. Each of the connections 601 to the bases of certain of the transistors is connected to a source of injection current, such as a resistor current source as shown in FIG. 4A or a PNP current source of a type known in the art.

Line 602 provides a clock signal $\overline{LAC1}$ for the bit 600 at the base of transistor Q8. Line 604 connects the base of transistor Q14 to an input multiplexer (not shown), which supplies an $\overline{SSSAC1}$ control signal on line 604. Line 606 is connected to the base of transistor Q15 and supplies a $\overline{DSLF}$ control signal, indicative of one type of data to be supplied to the bit 600. Line 608 is connected to the base of transistor Q16 and supplies a $\overline{DSRT}$ control signal. Line 610 connects the base of transistor Q2C to the second collector of a transistor in bit 0 of the AC1 register which corresponds to transistor Q13 shown. Lines 612 and 614 respectively connect the base of transistors Q10 and Q12 to a source of dual select signals $\overline{ESAC1}$ and $\overline{EDAC1}$. Lines 616 and 618 form a dual port multiplexed output from the AC1 bit 600 shown. These lines are also shared among the accumulators to cut the number of output leads down to two, rather than using separate multiplexer trees. Line 620 connects the base of transistor Q2B to the collector of transistor Q13 in bit 2 of the AC1 register. The emitters of transistors Q1-Q16 are all grounded. Transistor Q1 forms an inverter for the $\overline{SSUM}$ input on line 621. Transistors Q2A-Q2C and Q14-Q16 form an input data multiplexer 622 for the bit 600. Transistors Q3-Q8 form a D flip-flop circuit corresponding to that employed in the commercially available 74LS74 type flip-flop integrated circuit, available from Fairchild Camera and Instrument Corporation, Mountain View, California and described in the publication "TTL Data Book," published in 1978 by Fairchild, the disclosure of which is incorporated by reference herein. Transistors Q9-Q12 form an output multiplexer 623 for the bit 600. The circuit of FIG. 5 with only one source of input information is employed in the AC0, AC2, AC3, stack pointer and frame pointer registers in register file 166 (FIG. 1) as well.

Figure 5A:
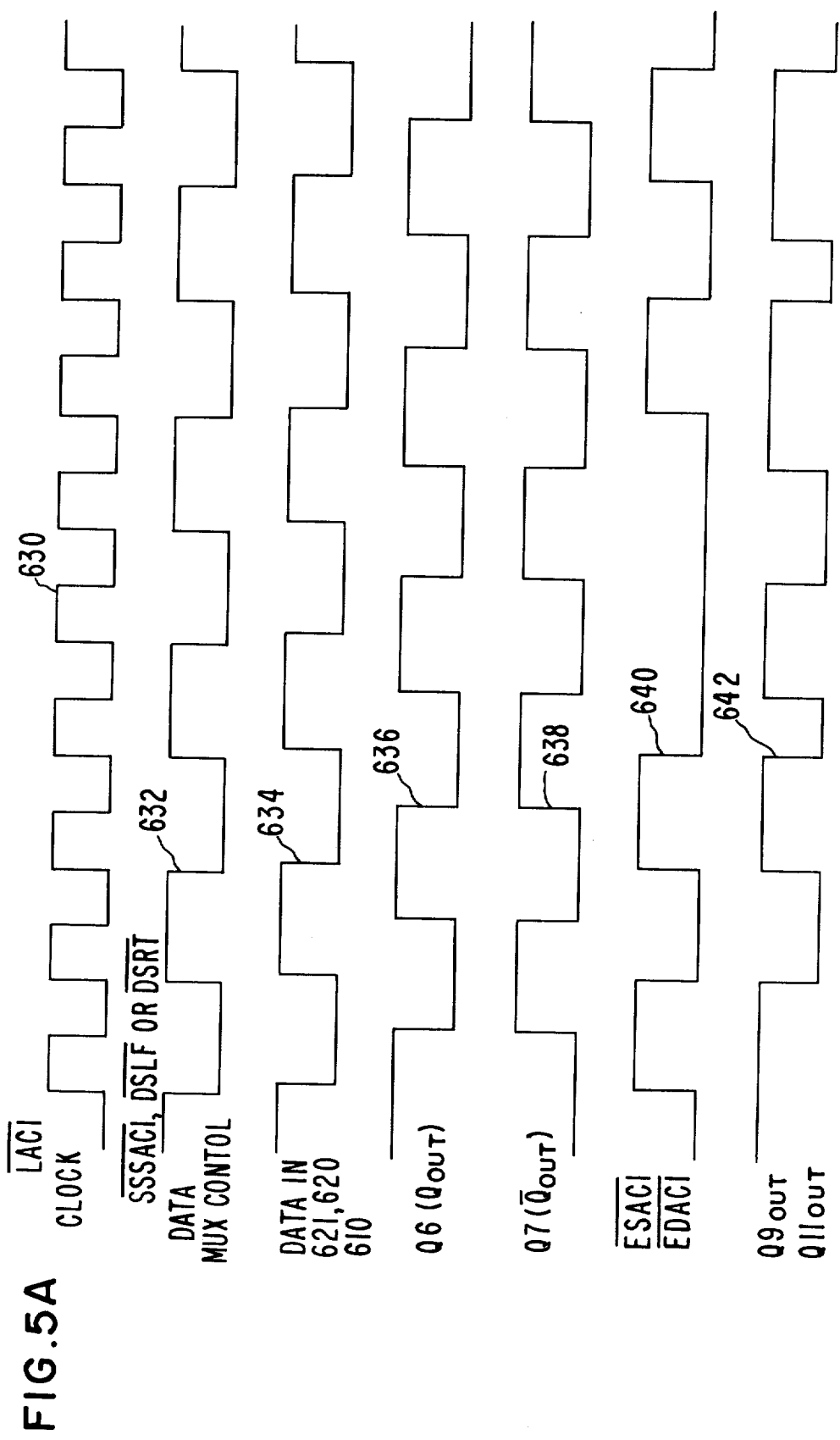
FIG. 5A is a set of waveform diagrams useful for understanding operation of the circuit in FIG. 5.

FIG. 5A is a set of waveform diagrams useful for understanding operation of the bit 600 shown in FIG. 5. The $\overline{LAC1}$ waveform 630 provides the clock pulse input to the D flip-flop comprised of transistors Q3-Q8. Internally, this flip-flop operates in the same manner as the 74LS74 type flip-flop, and its operation will not be explained in further detail. Due to the presence of the input and output multiplexers 622 and 623, the source of signals stored in bit 600 and their destinations may be varied as required in operation of the AC1 register. The $\overline{SSSAC1}$, $\overline{DSLF}$ and $\overline{DSRT}$ signals, respectively supplied on lines 604, 606 and 608 and represented by waveforms 632, are control signals for controlling data input to the input data multiplexer 622 for the bit 600. In each case, the selected control line is low in the active state, and the unselected control lines are both high. Waveform 634 represents the data input on lines 621, 620 or 610, respectively, depending on which of the control signals represented by waveform 632 is supplied to the input data multiplexer 622. Those data inputs are, respectively, the shifted sum ($\overline{SSUM}$), the output from the transistor corresponding to Q13 in bit 2 of the AC1 register, or the data output of the corresponding transistor in bit 0 of the AC1 register. Waveforms 636 and 638 respectively represent the Q output at the collectors of transistor Q6 and the $\overline{Q}$ output at the collectors of transistor Q7 of the D flip-flop. Waveform 640 respectively represents either the source output control signal $\overline{ESAC1}$ on line 612 or the destination output control signal $\overline{EDAC1}$ on line 614, depending on whether the $\overline{Q}$ output of the D flip-flop is to be supplied to the source multiplexer 132 or the destination multiplexer 134 in FIG. 1. Waveform 642 respectively represents the output at the collector of transistors Q9 or Q11, depending on whether the source or destination output is selected.

Figure 6:
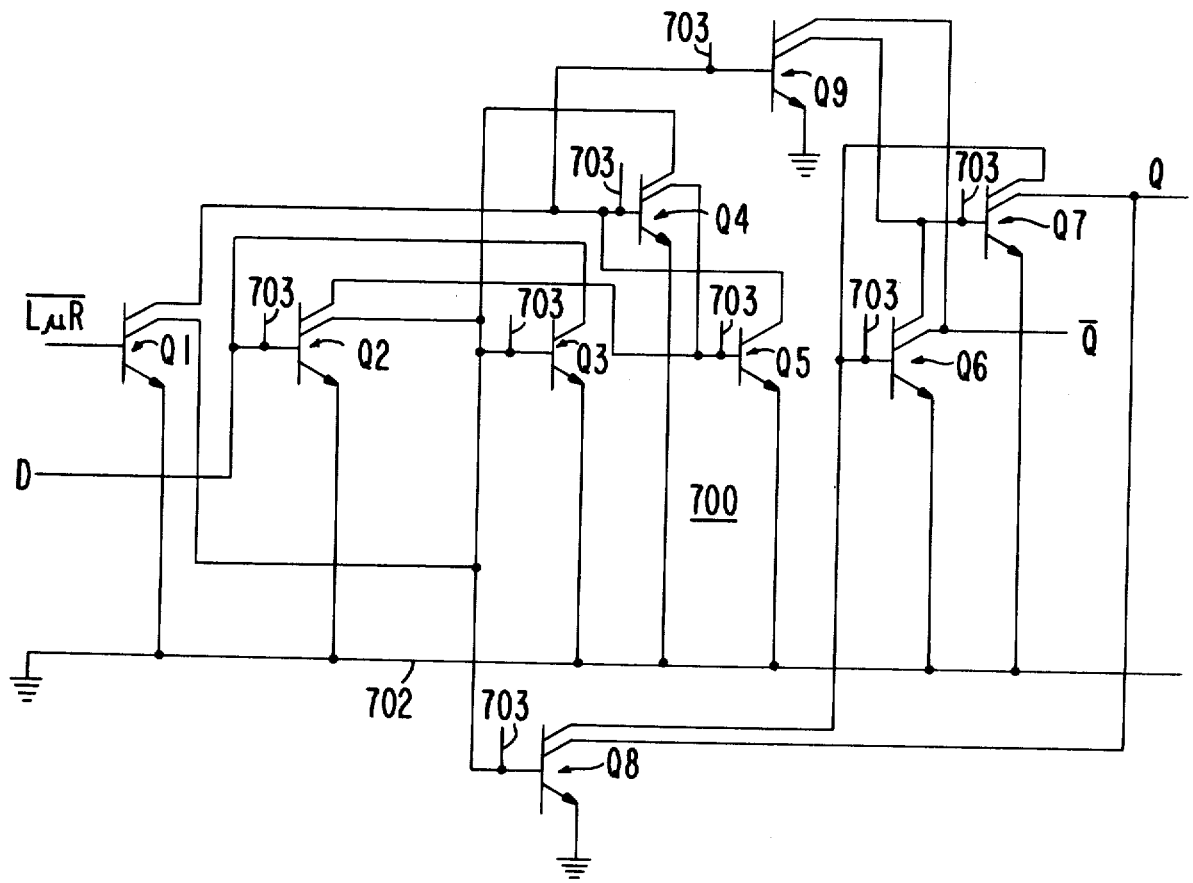
FIG. 6 is a circuit diagram of a high speed flip-flop circuit employed in the microprocessor integrated circuit of this invention.

FIG. 6 is a circuit schematic of a high speed feed forward D-type flip-flop, which is used in the outputs of the PLA 206. This circuit 700 is also used for the D type flip-flops in control logic 502 and A register 212 (FIG. 3). Transistor Q1 is connected to receive a $\overline{L\mu R}$ clock signal from clock timing strobe generator 300 at its base. The first multiple collector of transistor Q1 is connected to the bases of transistors Q4 and Q9. The second multiple collector is connected to the bases of transistors Q3 and Q8. The D input of the flip-flop 700 is connected to the base of transistor Q2. Depending on where the flip-flop 700 is used in the integrated circuit 500, the D input is selected from the DCON, SCON, SL89, INC, MAR, $\mu$RR/W, 02, 01 and 00 signals. The first multiple collector of transsistor Q2 is connected to the bases of transistors Q3 and Q8. The first multiple collector of transistor Q4 is also connected to the bases of transistor Q3 and Q8. The second multiple collector of transistor Q4 and the second multiple collector of transistor Q2 is connected to the base of transistor Q5. The collector of transistor Q5 is connected to the base of transistor Q4. The base of transistor Q6 is connected to receive inputs from the first multiple collector of transistors Q7 and Q8. The first multiple collector of transistor Q6 is connected to the base of transistor Q7. The second multiple collector of transistor Q9 is connected to the base of transistor Q7. The second multiple collector of transistor Q6, in common with the first multiple collector of transistor Q9, forms the Q output of the flip-flop 700. The second multiple collector of transistor Q7, in common with the second multiple collector of transistor Q8, forms the $\overline{Q}$ output of the D flip-flop 700. The emitters of the transistors Q1-Q7 are grounded by the line 702. The emitters of transistors Q8 and Q9 are also grounded. The bases of transistors Q2 through Q8 are connected to a source of injection current as indicated at 703 in each case.

In this circuit, the provision of transistor Q8 in parallel with transistor Q3 feeds forward the Q output of the D flip-flop 700 and reduces the transmission of a clock signal at the base of transistor Q1 to the Q output to two device delays (i.e., transistors Q1 and Q8) for the high to low signal transition compared to four device delays without the presence of transistors Q8. A similar advantage in speed is obtained with the presence of transistor Q9 parallel to transistor Q4 for the $\overline{Q}$ output.

Depending on where the flip-flop circuit 700 is used in the integrated circuit 500, the Q and $\overline{Q}$ outputs represent respectively, the $\mu$RDCON and $\overline{\mu RDCON}$ signals, the $\mu$RSCON and the $\overline{\mu RSCON}$ signals, the $\mu$RSL89 and $\overline{\mu RSL89}$ signals, the $\mu$RINC signal ($\overline{Q}$ terminal not used), the $\mu$RMAR and $\overline{\mu RMAR}$ signals, the $\mu$R/RW and $\overline{\mu R/RW}$ signals, the $\mu RO2$ and $\overline{\mu RO2}$ signals, the $\mu RO1$ and $\overline{\mu RO2}$ signals, or the $\mu RO0$ and $\overline{\mu RO0}$ signals.

Figure 6A:
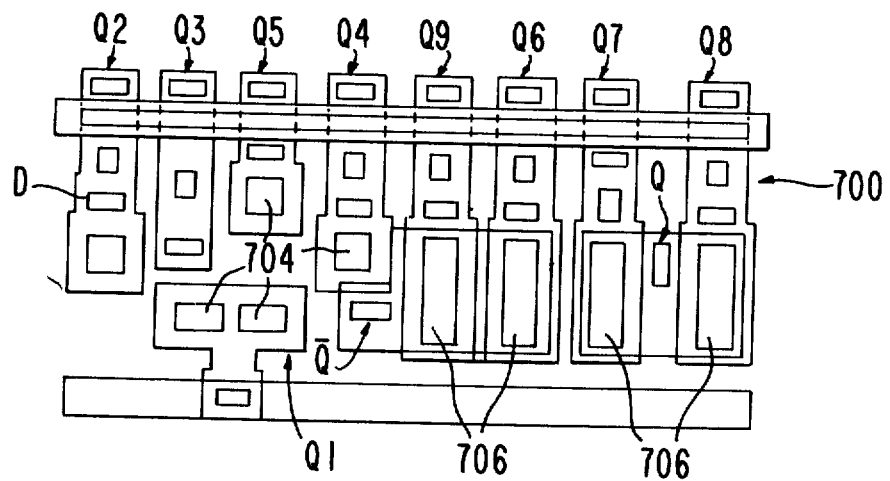
FIG. 6A is a plan view of an integrated circuit layout corresponding to the circuit schematic of FIG. 6.

FIG. 6A is a plan view of the layout of a D-type flip-flop circuit 700 in the integrated circuit 500. Each of the transistors Q1 through Q9 is indicated. It should be noted that the second multiple collectors 704 of devices Q2 and Q4 are shown as twice the size of their first multiple collectors and the collectors 704 of transistors Q1 and Q5 are twice the size of the collector of, for example, transistor Q3. Additionally, the second multiple collectors 706 of transistors Q6 through Q9 are six times the size of their first multiple collectors.

The double sized collectors are employed where a device drives more than one other device. The six times larger collectors are for driving a bus type structure. Comparable layouts are employed for the other I$^2$L circuits discussed in this application.

The waveform diagrams shown in FIG. 6B are useful for a further understanding of the operation of the high-speed feed forward D-type flip-flop circuit 700. Waveform 710 represents the $\overline{L\mu R}$ clock signal applied to the base of transistor Q1 in the flip-flop circuit. Waveform 712 represents the data input to the flip-flop, supplied to the base of transistor Q2. Waveforms 714 and 716 respectively represent the Q and $\overline{Q}$ outputs of the flip-flop 700. As shown, the high to low transition 718 of waveform 710 initiates sampling of the data waveform 712. Since the Q output 714 is low at this time, and the data input 712 is high, a low to high transition 720 occurs on the Q output waveform 714 three device delays later. The $\overline{Q}$ output waveform 716 correspondingly has a high to low transition 722 two device delays later than high to low transition 718 of waveform 710. The next high to low transition 724 of clock waveform 710 initiates another sampling of the data. At this time, the data waveform 712 is low, and a high to low transition 726 in Q output waveform 714 occurs two device delays later. A low to high transition 728 in $\overline{Q}$ output waveform 716 occurs three device delays after the high to low transition 724 of clock waveform 710. It should be recognized that, without the presence of feed forward devices Q8 and Q9, the waveforms 714 and 716 would be shifted to the right as a result of further device delays, as discussed above.

Figure 7:
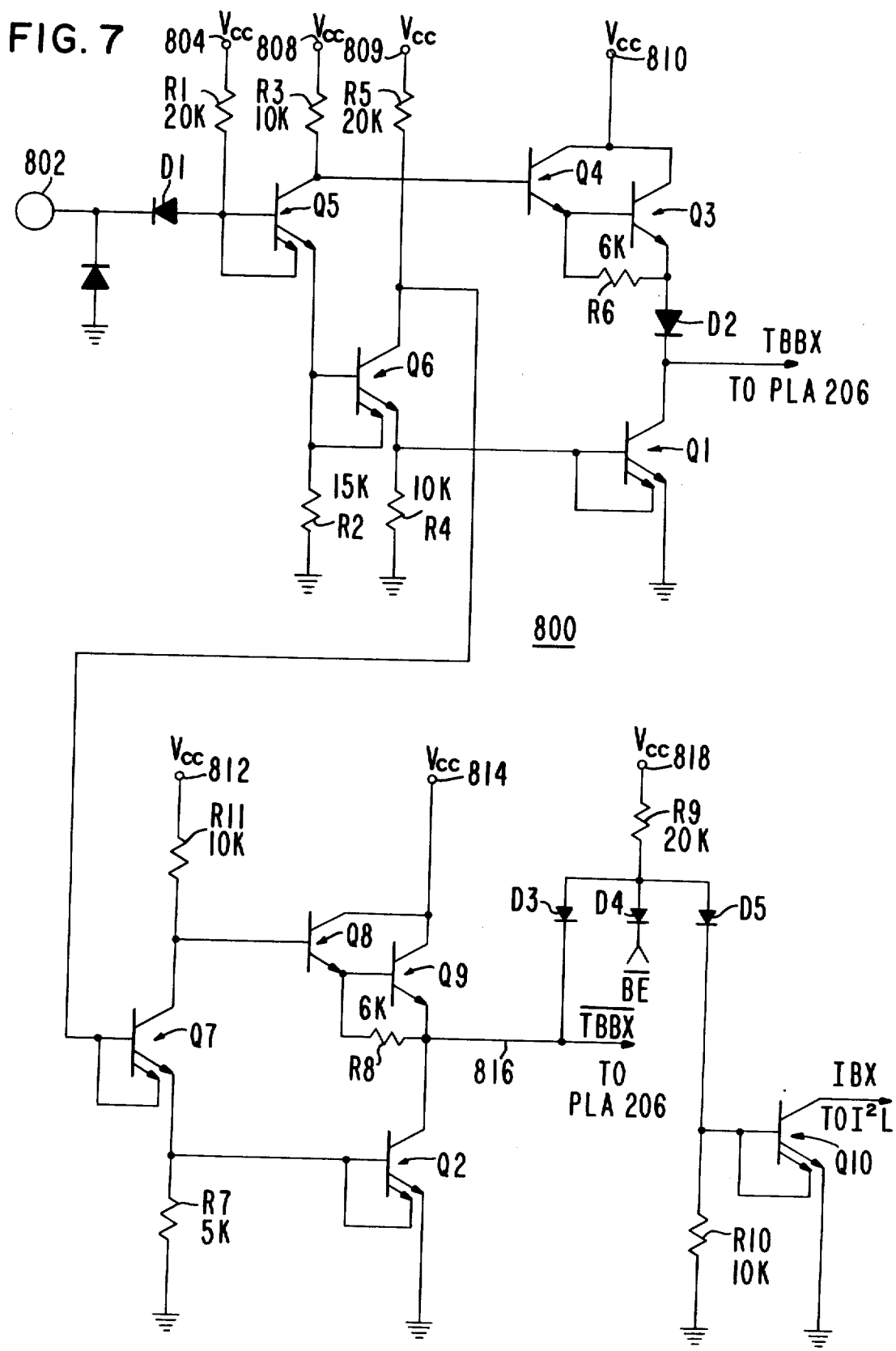
FIGS. 7 and 8 are circuit implementations of the block diagram portion shown in FIG. 1A.

FIG. 7 shows an input buffer 800 for the PLA 206 and various other portions of the chip. Unlike the circuits discussed previously, the circuit 800 is implemented in T$^2$L technology. Diode D1 is connected to supply an input from terminal 802 to the base of transistor Q5. Another input to transistor Q5 is supplied to its base via resistor R1. The first emitter of transistor Q5 is connected to its base. The second emitter of transistor Q5 is connected to the base of transistor Q6 and, through R2, to ground. The output of transistor Q5 is supplied at its collector to the base of transistor Q4. Another input to the base of transistor Q4 is supplied via resistor R3 from terminal 808. The first emitter of transistor Q6 is connected to its base. Resistor R4 is connected between ground and the second emitter of transistor Q6. The collector of transistor Q6 is connected through resistor R5 to terminal 809 and to the base of transistor Q7. Resistor R4 also is connected between ground and the base of transistor Q1. The first emitter of transistor Q1 is connected to its base, and the second emitter is connected to ground. The collector of transistor Q1 is connected to provide a TBBX signal to PLA 206. Diode D2 also connects the collector of transistor Q1 to the emitter of transistor Q3. The emitter of transistor Q3 is tied to its base via resistor R6. The emitter of transistor Q4 is also connected to the base of transistor Q3. The collectors of transistors Q3 and Q4 are tied together at terminal 810. The first emitter of transistor Q7 is tied to its base. Resistor R7 is connected between ground and the second emitter of transistor Q7. The collector of transistor Q7 is connected to the base of transistor Q8. Terminal 812 is also connected to the base of transistor Q8 through resistor R11. The emitter of transistor Q8 is connected to the base of transistor Q9. The emitter of transistor Q9 is tied to its base through resistor R8. The collectors of transistors Q8 and Q9 are tied together at terminal 814. The second emitter of transistor Q7 is also connected to the base of transistor Q2. The first emitter of transistor Q2 is tied to its base, and the second emitter is grounded. The collector of transistor Q2 is connected to line 816, which supplies a $\overline{TBBX}$ input to PLA 206. Line 816 is connected, via diode D3 and resistor R9, to terminal 818. A $\overline{BE}$ signal is supplied through diode D4 and resistor R9 to terminal 818. Resistor R9, diode D5 and resistor R10 are connected between ground and terminal 818. The base of transistor Q10 is connected between resistor R10 and diode D5. The first emitter of transistor Q10 is tied to its base. The second emitter of transistor Q10 is grounded. The collector of transistor Q10 provides an IBX signal to an I$^2$L circuit element in each of the control logic 502, the bus multiplexer 158, and the data input.

The waveform diagrams of FIG. 7A are useful for understanding operation of the circuit in FIG. 7. Waveform 830 represents the input at terminal 802 of the circuit. Waveform 832 represents the TBBX output supplied from the circuit to PLA206, which tracks the input 830 at 802, but two device delays later. Waveform 834 represents the $\overline{TBBX}$ output of the circuit 800 to PLA206. Waveform 834 inversely tracks the waveform 830, but three device delays later. Waveform 836 represents the $\overline{BE}$ signal, which is active in its low state. Waveform 838 represents the IBX output signal from the circuit 800, supplied to circuit 900 of FIG. 8.

Figure 8:
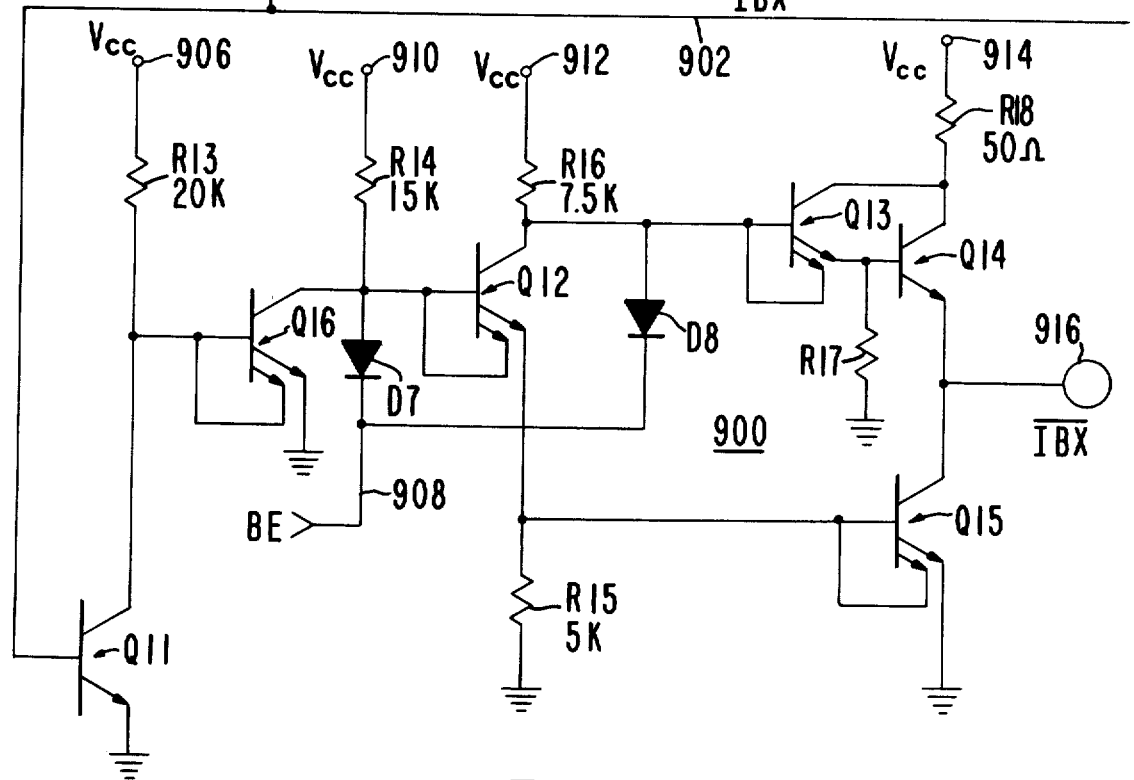

FIG. 8 shows a circuit schematic for a TTL output buffer cell 900. The IBX signal is supplied on line 902 to the base of transistor Q11. Terminal 904 is connected to the base of transistor Q11 via resistor R12. The emitter of transistor Q11 is grounded. The collector of transistor Q11 is connected to the base of transistor Q16. Terminal 906 is also connected to the base of transistor Q16 through resistor R13. The first emitter of transistor Q15 is tied to its base. The second emitter is grounded. The collector of transistor Q16 is connected to the base of transistor Q12. Line 908 supplies a BE signal through diode D7 to the base of transistor Q12. Terminal 910 is also connected, through resistor R14, to the base of transistor Q12. The first emitter of transistor Q12 is tied to its base, and the second emitter is connected to the base of transistor Q15. The second emitter of transistor Q12 is also connected through resistor R15 to ground. The collector of transistor Q12 is connected to the base of transistor Q13. The base of transistor Q13 and collector of transistor Q12 are connected to receive the BE signal through diode D8, and are also connected to terminal 912 by a resistor R16. The first emitter of transistor Q13 is tied to its base. The second emitter of transistor Q13 is connected to the base of transistor Q14 and, through resistor R17, to ground. The collector of transistor Q13 and the collector of transistor Q14 are tied together and connected to terminal 914 through resistor 18. The emitter of transistor Q14 is tied to the collector of transistor Q15. The first emitter of transistor Q15 is tied to its base, and the second emitter is grounded. Terminal 916 supplies an $\overline{IBX}$ signal provided as an output from the circuit 900.

The waveform diagrams in FIG. 8A are useful for understanding the operation of th output cell 900. Waveform 950 is the input IBX signal. Waveform 952 is the $\overline{IBX}$ output signal, which tracks the IBX input waveform 950 inversely, except that the $\overline{IBX}$ output 952 is three stated when the BE waveform 954 is low.

Figure 9:
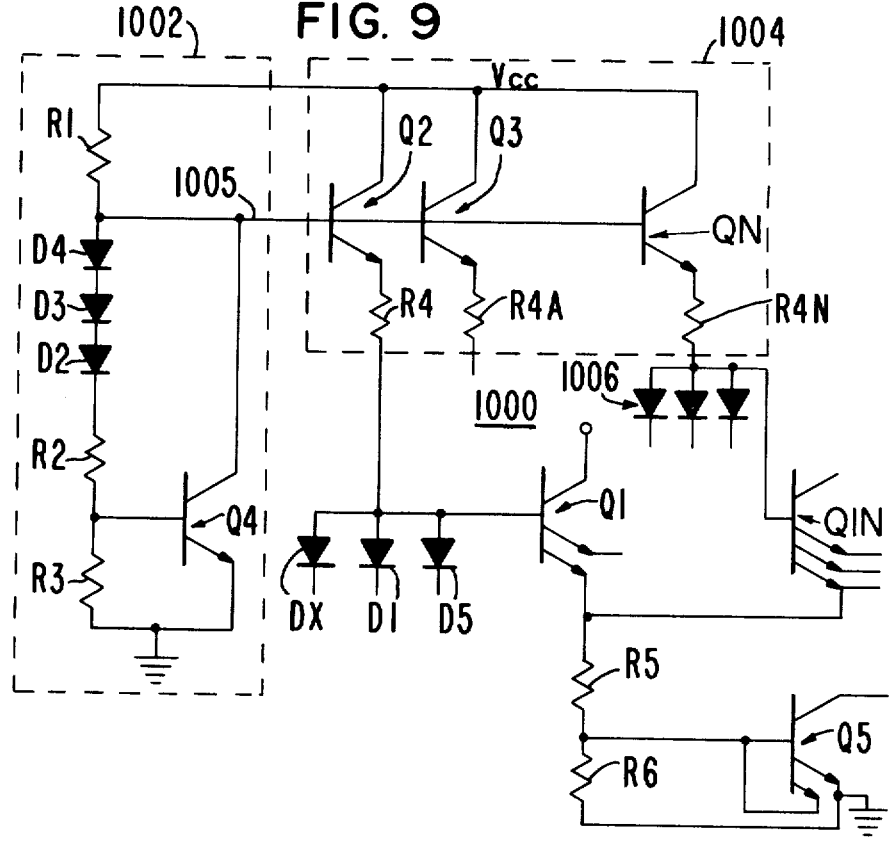
FIG. 9 is a schematic diagram of a PLA circuit employed in the microprocessor of this invention.

FIG. 9 shows a circuit schematic of a PLA circuit 1000 for use in the PLA 206. Terminal 818 in FIG. 7 provides an input through diode D1 to the base of transistor Q1. An input to the base of transistor Q1 is also supplied through resistor R4 from the emitter of transistor Q2. The base of transistor Q2 and the base of transistor Q3 are connected to the collector of transistor Q4. The emitter of transistor Q4 is grounded. The base of transistor Q4 is connected by a resistor R3 to ground and, via a resistor R2 and diodes D2, D3 and D4, to the base of transistor Q2. Resistor R1 is connected between the collectors of transistors Q2 and Q3 and their bases. A first emitter of transistor Q1 is connected by a resistor R5 to the base of transistor Q5. One emitter of transistor Q5 is tied to its base, and the other emitter is grounded. The first emitter of transistor Q1 is also connected to ground through the resistors R5 and R6.

Portion 1002 of the PLA circuit 1000 operates as a voltage regulator. Portion 1004 operates as a current source. The resistors R4 through R4N have a high temperature coefficient of resistance, and the voltage regulator portion 1002 regulates the voltage at output line 1005 to track what is happening at the resistors, thus controlling the voltage drop at diode D1. Diodes D1, D4 and DX form an AND gate. A similar AND gate is shown at 1006. The selection of devices to form these AND gates in the PLA is dependent on the PLA program. The first emitters of transistors Q1 and Q1N are connected together to form an OR gate. Such connections are also selectively made depending on the PLA program. The collector of transistor Q5 provides an output from the PLA circuit to microprogram register A or B (212 in FIG. 3).

Figure 10:
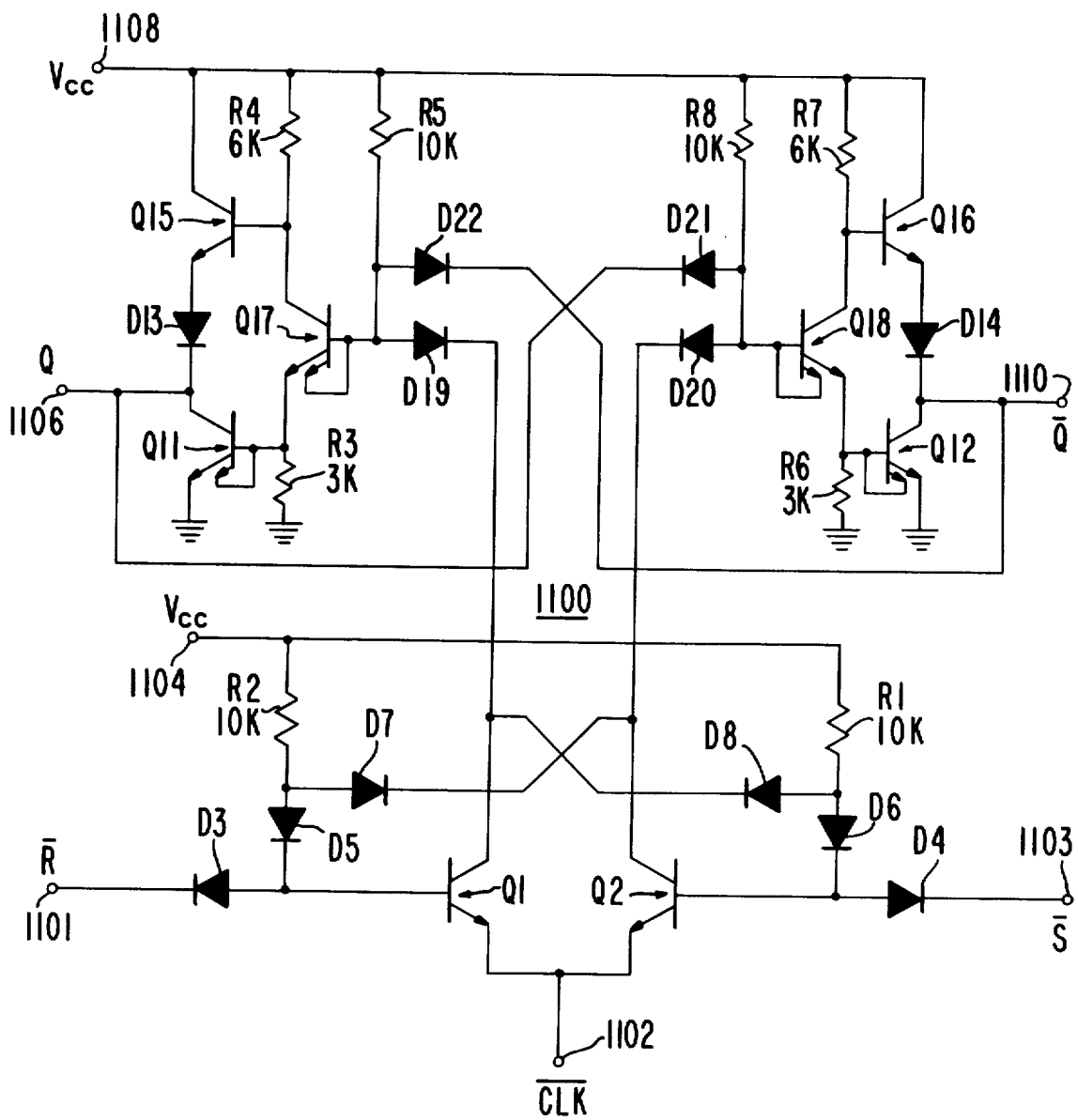
FIG. 10 is a circuit schematic of a masterslave flip-flop circuit employed in the microprocessor integrated circuit of this invention.

FIG. 10 shows a master-sleeve flip-flop circuit 1100 used in the clock timing and strobe generator 300 and in the microprogram registers 212 of FIG. 1. An $\overline{R}$ input at terminal 1101 is provided through diode D3 to the base of transistor Q1. A similar $\overline{S}$ input at terminal 1103 is provided through diode D4 to the base of transistor Q2. A $\overline{CLK}$ input is provided at terminal 1102 to the emitters of transistors Q1 and Q2. The collector of transistor Q1 provides an output through diode D19 to the base of transistor Q17. The collector of transistor Q1 is also connected by a diode D8 and resistor R1 to a Vcc terminal 1104. Diode D6 also connects the base of transistor Q2 to the Vcc terminal 1104 via resistor R1. Similarly, the collector of transistor Q2 provides an input through diode D20 to the base of transistor Q18. The collector of transistor Q2 is also connected via diode D7 and resistor R2 to the Vcc terminal. Diode D5 also connects the base of transistor Q1 to the Vcc terminal 1104 via resistor R2. The first emitter of transistor Q17 is tied back to its base. The second emitter of transistor Q17 is connected to the base of transistor Q11 and, through resistor R3, to ground. The collector of transistor Q17 is connected to the base of transistor Q15. The first emitter of transistor Q11 is tied back to its base. The second emitter of transistor Q11 is grounded. The collector of transistor Q11 is connected to the Q output terminal 1106 of the circuit, through diode D13 to the emitter of transistor Q15, and through diode D21, to the base of transistor Q18. The collector of transistor Q15 is connected to Vcc terminal 1108. Resistor R4 connects the Vcc terminal 1108 to the base of transistor Q15 and to the collector of transistor Q17. Resistor R5 connects the Vcc terminal to the base of transistor Q17. Diodes D21 and D22 provide a feedback path to form the slave flip-flop.

The first emitter of transistor Q18 is tied back to its base. The second emitter of transistor Q18 is connected to the base of transistor Q12 and, through resistor R6, to ground. The collector of transistor Q18 is connected to the base of transistor Q16. The first emitter of transistor Q12 is tied back to its base. The second emitter of transistor Q12 is grounded. The collector of transistor Q12 is connected to the $\overline{Q}$ output terminal 1110 of the flip-flop 1100. The collector of transistor Q12 is also connected through diode D14 to the emitter of transistor Q16, and, through diode D22, to the base of transistor Q17. The collector of transistor Q16 is connected to the Vcc terminal 1108. Resistor R7 also connects the Vcc terminal 1108 to the base of transistor Q16. Resistor R8 connects the Vcc terminal 1108 to the base of transistor Q18.

The waveform diagrams in FIG. 10A are useful for understanding operation of the master-slave flip-flop circuit 1100 of FIG. 10. Waveforms 1120 and 1122 are, respectively, the $\overline{R}$ and $\overline{S}$ inputs to the flip-flop circuit 1100. Waveform 1124 is the clock input at terminal 1102 of the circuit. Waveforms 1126 and 1128 are, respectively, the Q and $\overline{Q}$ outputs at terminals 1110 and 1106 of the circuit. The Q output of the circuit goes high when the $\overline{S}$ input is low, and the $\overline{Q}$ output of the circuit goes high when the $\overline{R}$ input is low.

FIGS. 11A and 11B show the counter 162 (FIG. 1) as implemented in the integrated circuit chip 500 (FIG. 3). The counter 162 consists of five positive edged triggered T flip-flop circuits 1200, 1202, 1204, 1206 and 1208 interconnected as a ripple down counter, plus a latch 1210 used as the most significant bit. Each of the T flip-flops 11200 through 1208 has a respective associated logic circuit 1212, 1214, 1216, 1218 and 1220. Each of the logic circuits 1212 through 1220 has a NAND gate 1222 havings its output connected to the set terminal of its associated flip-flop circuit 1200 through 1208. One input to NAND gate 1222 is provided by the output of inverter 1224. The other input is provided by the output of inveter 1226. OR gate 1228 has its output connected to the reset terminal of its associated flip-flop 1200 through 1208. One input to OR gate 1228 is provided by the output of inverter 1230, a second input is provided by the output of inverter 1232 and a third input is provided by the output of NAND gate 1234. Inverters 1226 and 1236 provide the inputs to NAND gates 1234. The input of inverter 1236 is connected to receive the outpu of inverter 1224. The input of inverter 1224 is connected to receive an $\overline{SSUM15}$ signal. The input of inverter 1226 is connected to receive an $\overline{LDCS}$ signal. The input of inverter 1230 is connected to receive an LDC32 signal, and the input of inverter 1232 is connected to receive an LDC16 signal. The corresponding inverters in logic circuits 1214-1220 are connected in the same manner except that inverter 1224 in logic circuit 1214 is connected to receive an $\overline{SSUM14}$ signal, the inverter 1224 in logic circuit 1216 is connected to receive an $\overline{SSUM13}$ signal, the inverter 1224 in logic circuit 1218 is connected to receive an $\overline{SSUM12}$ signal and the inverter 1224 in logic circuit 1220 is connected to receive an $\overline{SSUM11}$ signal. Also, the output of NAND gate 1222 in logic circuit 1220 forms one input to OR gate 1240. The other input to OR gate 1240 is connected to receive the output of inverter 1242, the input of which is connected to receive the LDC16 signal. The output of OR gate 1240 is connected to the set terminal of flip-flop 1208. The T1 and T2 terminals of flip-flop 1200 are connected to receive the output of inverter 1244, the input to which is a $\overline{CNCLK}$ signal. The Q output of flip-flop 1200 provides the T1 and T2 inputs to flip-flop 1202. The Q output of flip-flop 1200 provides the input to inverter 1246. The output of inverter 1246 is connected to one input of NAND gate 1248. The other input to NAND gate 1248 is provided by the output of inverter 1250, which is connected to receive a $\overline{ECND}$ signal. The output of NAND gate 1248 is a $\overline{D15}$ signal. The output of inverter 1246 is also provided as an input to inverter 1255. The output of inverter 1255 is connected to the input of inverter 1259. The Q output of flip-flop 1202 is supplied as the T1 and T2 inputs to flip-flop 1204. The $\overline{Q}$ output of flip-flop 1202 is supplied as the input to inverter 1254. The $\overline{Q}$ input of flip-flop 1202 is also supplied as an input to NAND gate 1252. The output of inverter 1254 forms one input to NAND gate 1256. The other input to NAND gate 1256 is provided by the output of inverter 1258, the input of which is connected to receive the $\overline{ECND}$ signal. The Q output of flip-flop 1204 provides the T1 and T2 inputs to flip-flop 1206. The $\overline{Q}$ output of flip-flop 1204 is supplied to inverter 1260 and as another input to NAND gate 1252. The output of inveter 1260 forms one input to NAND gate 1262. The other input to NAND gate 1262 is provided by the output of inverter 1264, which is connected to receive the $\overline{ECND}$ signal. The output of inverter 1262 is the $\overline{D13}$ signal. The Q output of inverter 1206 provides the T1 and T2 inputs to flip-flop 1208. The $\overline{Q}$ output of flip-flop 1206 provides the input to inverter 1266 and is supplied as a third input to NAND gate 1252. The output of inverter 1266 provides one input to NAND gate 1268. The other input to NAND gate 1268 is provided by the output of inverter 1270, the input of which is the $\overline{ECND}$ signal. The output of NAND gate 1268 is the $\overline{D12}$ signal. The $\overline{Q}$ output of flip-flop 1208 provides the input to inverter 1272 and is the remaining input to NAND gate 1252. The output of inverter 1272 forms one input to NAND gate 1274. The other input to NAND gate 1274 is provided by the output of inverter 1276, the input of which is the $\overline{ECND}$ signal. The output of NAND gate 1274 is the $\overline{D11}$ signal.

FIG. 12 shows logic diagram details of the T flip-flops 1200 through 1208. These flip-flops are positive edge triggered. The T1 and T2 inputs are respectively supplied to NAND gates 1280 and 1282. Another input to NAND gate 1280 is supplied by the output of OR gate 1284. The third input of NAND gate 1280 is connected to the reset terminal of the flip-flop. One input OR gate 1284 is provided by the output of NAND gate 1280. A second input is provided from the set terminal of the flip-flop. A third input is provided by the output of OR gate 1286. One input to OR gate 1286 is provided by the reset terminal of the flip-flop. The second input is provided by the $\overline{Q}$ output of the flip-flop, and the third input is provided by the output of NAND gate 1282. The output of NAND gate 1280 provides a second input to NAND gate 1282. The remaining input to NAND gate 1282 is provided by the output of OR gate 1286. The output of NAND gate 1280 provides one input to OR gate 1288. A second input to OR gate 1288 is provided by the set terminal of the flip-flop. The third input is provided by the $\overline{Q}$ output of the flip-flop. The output of OR gate 1288 is the Q output of the flip-flop, which is provided as an input to OR gate 1290. A second input to OR gate 1290 is provided by the output of NAND gate 1282, and the third input to OR gate 1290 is provided by the reset terminal of the flip-flop. The output of OR gate 1290 is the $\overline{Q}$ output of the flip-flop.

Returning to FIGS. 11A and 11B, latch 1210 includes inverters 1292 and 1294. The input of inverter 1292 is connected to receive the LDC32 signal. The output of inverter 1292 forms one input of OR gate 1296. The input of inverter 1294 is connected to receive the output of inverter 1244. The output of inverter 1294 forms one input to OR gate 1298. The output of OR gate 1298 is the $\overline{Q}$ output of the latch and forms a second input to OR gate 1296. The output of OR gate 1296 is the Q output of the latch and is supplied as a second input to OR gate 1298. The output of OR gate 1298 is supplied as one input to NAND gate 1300. The second input to NAND gate 1300 is provided by the output of inverter 1302, the input of which is connected to receive the $\overline{ECND}$ signal. The output of NAND gate 1300 provides the input to inverter 1304. The output of inverter 1304 is supplied to ALU 110 via bus 172, destination multiplexer 134 and bus 138 to ALU 110 (see FIG. 1).

The LDC32 signal serves to preset the counter 162 to the value $32_{10}$. The LDC16 signal serves to preset the counter 162 to the value $16_{10}$. The $\overline{LDCS}$ signal loads the counter 162 to a desired value supplied on bus 164 (FIG. 1). Inverters 1246, 1254, 1260, 1266, 1272, 1250, 1258, 1264, 1270, 1276, NAND gates 1248, 1256, 1262, 1268 and 1274, inverter 1302, NAND gate 1300 and inverter 1304 serve to read the final sign extended contents of the counter 162 onto the destination bus 172 for supply to ALU 110.

Gate 1252 detects either the 00000 or 00001 state of the counter 162 and is connected to the input of inverter 1253. The output of inverter 1253 is connected to one input of NAND gate 1261. The other input of NAND gate 1261 is connected to the output of inverter 1259. The output of NAND gate 1261 comprises the $\overline{ONE}$ signal, indicating counter 162 is in the 00001 state. Inverter 1253 is also connected to one input of AND gate 1257. The other input to AND gate 1257 comes from inverter 1255. The output of AND gate 1257 is the CZERO signal indicating that the counter is in the 00000 state.

The number of operations to be performed during repetitive cycles of various instructions being executed by the microprocessor is supplied to the counter 162 as a positive number from zero to $31_{10}$. The counter must therefore count down toward zero to perform the required number of steps automatically. While the counter 162 could be implemented as a fully synchronous parallel counter, it has been implemented as a serial ripple counter as shown. The ripple counter has an advantage over the synchronous counter in that the number of gates required is about half that required for the synchronous counter. Serial delays in the ripple counter are minimized in the present design by interconnecting the Q output of the transistor 1288 in each flip-flop to the clock inputs, i.e., transistors 1280 and 1282 of the subsequent stage. This means that only two gate delays per stage are encountered when cascading stages.

With the design shown in FIGS. 11 and 12, only two states of the counter must be uniquely decoded, i.e., 00001 and 00000. Only the least two significant bits of the counter change as the counter sequences from $2_{10}$ (00010) to 1 (00001), so that there are only four gate delays before the correct signals are present at the output of the counter. Only the least significant bit of the counter changes on the 1 to 0 transition, so that the number of delays is only 2, less than it would be in a synchronous implementation.

The counter 162 must be capable of assuming 33 unique states during the execution of a normalize instruction. It takes 0 shifts to normalize a 32 bit number in the AC0 or AC1 registers, if it is already normalized, and counter 162 remains equal to $32_{10}$. Alternatively, it may take from 1 to 31 shifts to normalize the number, with the counter counting down from $32_{10}$ to 1. If the number was initially equal to 0, the process will terminate after a maximum of 32 shifts, because the counter will reach 0. It takes a minimum of six stages to represent 33 unique states, because $2^5=32$. The sixth stage of the counter 162 is implemented as the latch 1210, which is set whenever the counter is initialized to the $32_{10}$ state, and it is cleared on any count signal applied to the counter. By this means, the state of this latch is used to distinguish between $32_{10}$ and 0. This implementation saves the serial delay of the previous five stages and results in fewer gates than adding a sixth T flip-flop.

The counter 162 is operated as follows for the operation specified. For signed and unsigned multiplication instruction, a total of $16_{10}$ cycles are required. The counter is preset with $16_{10}$, counted down and the instruction terminated when the counter reaches 0. For a signed multiply, a decode is carried out when the counter reaches 1 and the last cycle is modified. For signed and unsigned divide instructions, 16 cycles are required. The counter is preset with $16_{10}$, it is counted down, and the instruction is terminated when the counter reaches 0. Normalize instructions require a variable number between 0 and $31_{10}$ cycles. The counter is preset with $32_{10}$, it is counted down, and terminated by external conditions or when the counter reaches 0. The twos complement of the number of shifts is read back if the number of shifts is between 1 and $31_{10}$. 0 is read back if the number is initially normalized. $-32_{10}$ is read back if the counter reaches 0. For parametric shift instructions, a variable number from 0 to $31_{10}$ cycles is required. The counter is set to the variable number, counted down, and the instruction terminated when the counter reaches 0.

As embodied in the integrated circuit shown in FIG. 3, the microprocessor integrated circuit of this invention provides significant speed and performance advantages over prior art microprocessor integrated circuits. The performance advantages of this invention are summarized in the following table, which compares the performance characteristics of the invention against five commercially available microprocessor integrated circuits, each identified by their product type number. The results show that the invention has significance speed advantage in all commonly used categories of operations over any of the prior art microprocessor integrated circuits. As a result, the integrated circuit of this invention should materially increase the utilization of microprocessors in environments where high performance is required.

TABLE I

| | % Mix | Base execution times in microseconds (µs) at nominal clock speeds | | | | | |
|---|---|---|---|---|---|---|---|
| | | Inv. | 68000 | 8086 | Z8000 | 9900 | 9440 |
| CPU operations | | | | | | | |
| ALU instructions | | 0.3 | 0.5 | 0.38 | 1 | 3.36 | 1.25 |
| Hardware multiply | | 3.5 | 8.75 | 15.5 | 17.25 | 12.5 | |
| Hardware divide | | 5.7 | 17.75 | 19.4 | 25 | 25.9 | |
| Memory operations | | | | | | | |
| Load, Store | | 0.6 | 1.75 | 1.9 | 2.5 | 5.28 | 3.08 |
| Test and Branch | | 0.6 | 1.75 | 1 | 1.5 | 2.4 | 3.66 |
| I/O control operations Instructions | | 0.8 | 1.25 | 1.25 | 2.25 | 2.88 | 2.08 |
| ALU | 25 | 7.5 | 12.5 | 9.5 | 25 | 84 | 31.3 |
| MPY | 6 | 21 | 52.5 | 93 | 103.5 | 75 | 396.6 |
| DIV | 1.5 | 8.6 | 26.6 | 29.1 | 37.5 | 38.9 | 168.8 |
| Load, Store | 35 | 21 | 61.3 | 66.5 | 87.5 | 184.8 | 107.8 |
| Test and Branch | 30 | 18 | 52.5 | 30 | 45 | 72 | 109.8 |
| I/O control | 2.5 | 2 | 3.1 | 3.1 | 5.6 | 7.2 | 7 |
| Total | 100% | 78.1 | 208 | 231.6 | 303.6 | 461.9 | 823.3 |
| Normalization | | 1 | 2.66 | 3 | 3.89 | 5.91 | 10.5 |

It should now be apparent to those skilled in the art that a microprocessor integrated circuit capable of achieving the objects of the invention has been provided. The T$^2$L-I$^2$L interface circuit and structure employed in this microprocessor facilitates more effective partitioning between T$^2$L and I$^2$L circuits in the microprocessor. Through use of the information bus structure described above, the number of lines in internal bus structures of the microprocessor is reduced. The PLA of this microprocessor operates more reliably over an increased temperature range than comparable prior art PLAs. The flip-flop circuits employed in registers of the microprocessor have a reduced time delay where speed is the primary consideration and implement multiplexed inputs and outputs more effectively than in the prior art. The cycle counter of this invention allows repetitive instructions to be implemented more effectively with a minimum number of circuit elements. The master-slave flip-flop circuit of this invention eliminates sensitivity of prior art timing circuits to noise, especially at elevated temperatures.

It should further be apparent to those skilled in the art that various changes in form and details of the invention as shown and described above may be made. It is intended that such changes be included within the spirit and scope of the claims appended hereto.

I claim:
1. A microprocessor integrated circuit having a central processing unit which includes
   a. a data path unit comprising independent address data path circuitry and independent ALU data path circuitry, said address data path circuitry and said ALU data path circuitry being simultaneously operational during a clocked cycle;
   b. information bus means operatively connected to said data path unit for supplying address and data information thereto and for receiving address and data information therefrom, said information bus means comprising,

(i) a bidirectional input/output (I/O) buffer for receiving input information and supplying output information externally of the integrated circuit; and (ii) a bidirectional I/O multiplexer operatively connected (1) to said I/O buffer for receiving I/O multiplexer input information from said I/O buffer and for supplying I/O multiplexer output information to said I/O buffer, (2) to a bus register multiplexer for supplying address and data information thereto, said bus register multiplexer having multiple inputs thereto including an output of said ALU data path circuitry, said bus register multiplexer being operatively connected to both said data path circuitry and said ALU data path circuitry for selectively directing appropriate address or data information thereto and (3) to a bus multiplexer operatively connected to both said address data path circuitry and to said ALU data path circuitry for receiving multiple output signals from said data path circuitry and selectively directing appropriate of said signals to said I/O multiplexer.

2. The microprocessor integrated circuit of claim 1 wherein said bidirectional I/O multiplexer is operatively connected to a status register in said ALU data path circuitry for supplying I/O multiplexer output information thereto independently of said bus register multiplexer.

3. The microprocessor integrated circuit of claim 2 wherein an output of said status register is operatively connected to said bus multiplexer for supplying data information thereto.

4. The microprocessor integrated circuit of claim 2 wherein said bidirectional I/O multiplexer is operatively connected to an instruction register in a control unit for the microprocessor integrated circuit for supplying I/O multiplexer output information thereto independently of said bus register multiplexer.

5. The microprocessor integrated circuit of claim 4 wherein said instruction register includes a plurality of outputs connected to appropriate elements of said data path unit for providing control signals thereto.

6. The microprocessor integrated circuit of claim 3 wherein said bidirectional I/O buffer is operatively connected to a PLA in a control unit for supplying I/O buffer output information thereto.

7. The microprocessor integrated circuit of claim 6 wherein an output of said PLA is operatively connected to a microprogram register in said control unit for providing control program commands thereto.

8. The microprocessor integrated circuit of claim 1 wherein said bidirectional I/O buffer includes circuitry for converting TTL (transistor-transistor-logic) level signals to I$^2$L (integrated-injection logic) level signals for use by I$^2$L elements in said integrated circuit and converting I$^2$L level outputs from I$^2$L elements in said integrated circuit to TTL level signals for use by TTL elements in said integrated circuit or externally of said integrated circuit.

9. The microprocessor integrated circuit of claim 1 wherein said integrated circuit comprises TTL portions and an I$^2$L portion and further including a TTL-to-I$^2$L interface comprising:

a TTL output stage operatively connected to said TTL portions; and a plurality of I$^2$L input stages, each of which includes a bipolar transistor having an emitter coupled to a predetermined potential, a plurality of collectors, and a base coupled through a resistive element to said output stage for receiving an output signal from said output stage, each resistive element comprising a pair of regions of semiconductor material of a given conductivity type joined by a third region of semiconductor material of the given conductivity type having a cross-sectional area smaller than that of either of the pair.

10. The microprocessor integrated circuit of claim 9 wherein said ALU data path circuitry includes a first storage register comprising a first plurality of interconnected flip-flop circuits, output control circuitry being associated with each flip-flop circuit for selectively directing an output signal thereof to either a source or a destination input to an ALU of the ALU data path circuitry.

11. The microprocessor integrated circuit of claim 10 wherein said ALU data path circuitry includes a second storage register comprising a second plurality of flip-flop circuits each comprising a first latch responsive to a clock input signal and a data input signal, a second latch responsive to the clock input signal and a signal complementary to the data input signal, a third latch having a first output terminal for providing a first output signal and a second output terminal for providing a second output signal complementary to the first output signal, and a first transistor having an output electrode coupled to the first output terminal and an input parallel with an input electrode of a cross-coupled transistor in the first latch.

12. The microprocessor integrated circuit of claim 11 wherein each flip-flop circuit of the second plurality of flip-flop circuits includes a second transistor having an output electrode coupled to the second output terminal of that flip-flop circuit and an input electrode responsive to the clock input signal for that flip-flop circuit and coupled in parallel with an input electrode of a cross-coupled transistor in the second latch of that flip-flop circuit.

13. The microprocessor integrated circuit of claim 12 further including a timing unit having a transistor-transistor logic master-slave flip-flop circuit comprising a master flip-flop and a slave flip-flop, the master flip-flop circuit having a pair of bipolar transistors coupled between a source of clocking pulses and the slave flip-flop.

14. The microprocessor integrated circuit of claim 13 wherein said ALU data path circuitry includes a cycle counter comprising a third plurality of flip-flop circuits sequentially interconnected to operate as a ripple-down counter, an output terminal of the first one of each pair of consecutive ones of the third plurality of flip-flop circuits being coupled to two input terminals of the other of that pair for supplying two clock signals respectively thereto.

* * * * *